(12) United States Patent
Matsuura

(10) Patent No.: US 9,093,418 B2
(45) Date of Patent: Jul. 28, 2015

(54) MANUFACTURE METHOD FOR SEMICONDUCTOR DEVICE CAPABLE OF PREVENTING REDUCTION OF FERROELECTRIC FILM

(71) Applicant: FUJITSU SEMICONDUCTOR LIMITED, Yokohama-shi, Kanagawa (JP)

(72) Inventor: Katsuyoshi Matsuura, Kawasaki (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 0 days.

(21) Appl. No.: 14/157,752

(22) Filed: Jan. 17, 2014

(65) Prior Publication Data
US 2014/0134754 A1    May 15, 2014

Related U.S. Application Data

(60) Division of application No. 13/839,327, filed on Mar. 15, 2013, now abandoned, which is a division of application No. 12/624,081, filed on Nov. 23, 2009, now abandoned, which is a continuation of application No. PCT/JP2007/000593, filed on Jun. 1, 2007.

(51) Int. Cl.
*H01L 21/00* (2006.01)
*H01L 49/02* (2006.01)
*H01L 27/115* (2006.01)

(52) U.S. Cl.
CPC .......... *H01L 28/40* (2013.01); *H01L 27/11507* (2013.01); *H01L 28/57* (2013.01)

(58) Field of Classification Search
None
See application file for complete search history.

(56) References Cited

U.S. PATENT DOCUMENTS

| 6,469,333 | B1 | 10/2002 | Takai et al. | |
|---|---|---|---|---|
| 6,570,203 | B2 | 5/2003 | Hikosaka et al. | |
| 2001/0034106 | A1* | 10/2001 | Moise et al. | 438/396 |
| 2001/0044205 | A1* | 11/2001 | Gilbert et al. | 438/653 |
| 2003/0168750 | A1* | 9/2003 | Basceri et al. | 257/915 |
| 2004/0147046 | A1 | 7/2004 | Miura | |
| 2005/0087791 | A1* | 4/2005 | Park et al. | 257/310 |
| 2005/0285173 | A1* | 12/2005 | Nagai et al. | 257/296 |
| 2006/0118957 | A1 | 6/2006 | Ozaki | |

FOREIGN PATENT DOCUMENTS

| JP | 2001-044375 A | 2/2001 |
|---|---|---|
| JP | 2002-094021 A | 3/2002 |

(Continued)

OTHER PUBLICATIONS

International Search Report of PCT/JP2007/000593, mailing date of Aug. 14, 2007.

(Continued)

*Primary Examiner* — Yasser A Abdelaziez
(74) *Attorney, Agent, or Firm* — Westerman, Hattori, Daniels & Adrian, LLP

(57) ABSTRACT

A ferroelectric capacitor is formed on a semiconductor substrate, the ferroelectric capacitor comprising a lower electrode, a ferroelectric film and an upper electrode stacked in an order recited. A first capacitor protective film of aluminum oxide having a thickness equal to or thicker than 30 nm is formed covering the ferroelectric capacitor. A first insulating film of silicon oxide is formed on the first capacitor protective film by chemical vapor deposition using high density plasma.

4 Claims, 30 Drawing Sheets

(56) References Cited

FOREIGN PATENT DOCUMENTS

| | | |
|---|---|---|
| JP | 2003-218325 A | 7/2003 |
| JP | 2004-095755 A | 3/2004 |
| JP | 2004-193280 A | 7/2004 |
| JP | 2006-049795 A | 2/2006 |
| JP | 2006-186311 A | 7/2006 |
| JP | 2006-279083 A | 10/2006 |

OTHER PUBLICATIONS

Partial Translation of Written Opinion and International Search Report for PCT/JP2007/000593, mailing date of Written Opinion is Aug. 14, 2007.

Japanese Notice of Reasons of Rejection mailed May 29, 2012, issued in corresponding Japanese Patent Application 2009-517622, with English translation.

* cited by examiner

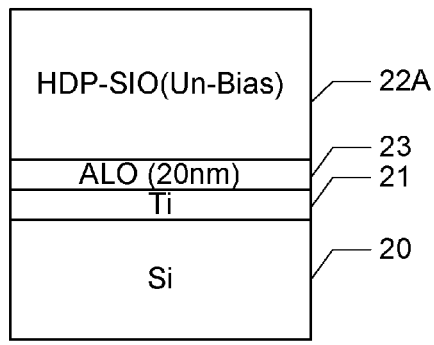
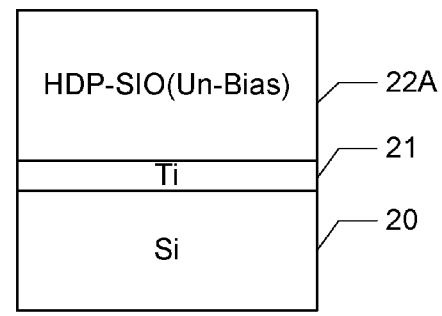
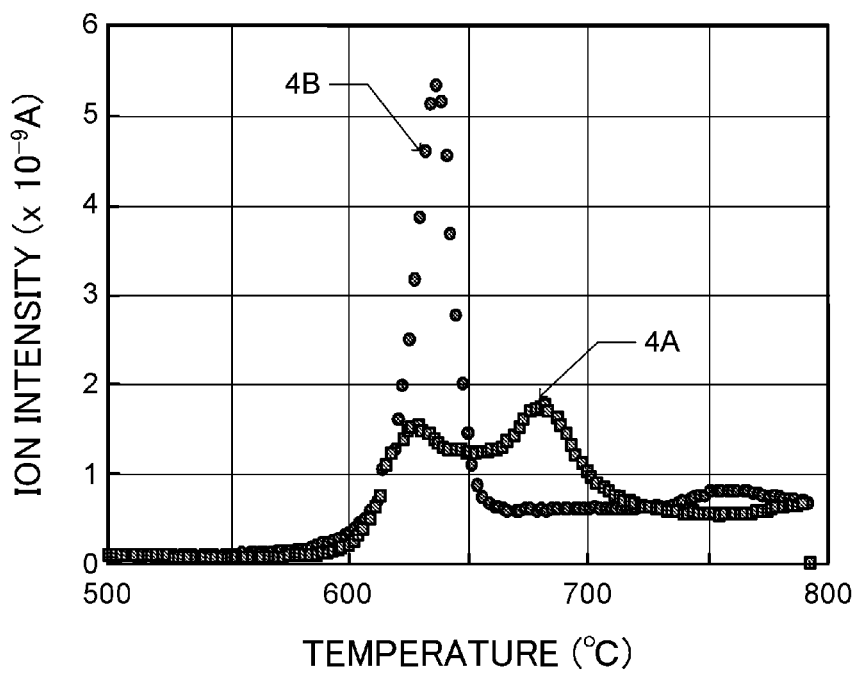

MANUFACTURE METHOD FOR SEMICONDUCTOR DEVICE CAPABLE OF PREVENTING REDUCTION OF FERROELECTRIC FILM

CROSS-REFERENCE TO RELATED APPLICATION

This application is a divisional of U.S. applicant Ser. No. 13/839,327 filed on Mar. 15, 2013, which is a divisional of U.S. application Ser. No. 12/624,081 filed on Nov. 23, 2009 which is based upon and claims the benefit of priority of the prior International Application No. PCT/JP2007/000593, filed on Jun. 1, 2007, the entire contents of which are incorporated herein by reference in their entirety.

FIELD

The embodiments discussed herein are related to a semiconductor device manufacture method, and more particularly to a semiconductor device including a capacitor protective film for preventing reduction of a ferroelectric film of a ferroelectric capacitor.

BACKGROUND

A ferroelectric memory (FRAM (a registered trademark of USA, Ramtron International Corporation)) has drawn attention as a nonvolatile memory capable of holding data even a power source is turned off.

Used as material of a capacitor dielectric film of a ferroelectric capacitor are PZT-based material such as $Pb(Zr,Ti)O_3$ (PZT) and La-doped PZT (PLZT), and Bi layer-structured compound such as $SrBi_2Ta_2O_9$ (SBT) and $SrBi_2(Ta,Nb)_2O_9$ (SBTN), which are ferroelectric material. These ferroelectric materials are easy to be reduced by hydrogen. Manufacture processes for a ferroelectric capacitor include a process during which hydrogen is generated, such as a process of forming an interlayer insulating film. In order to prevent a dielectric film of a ferroelectric capacitor from being reduced by hydrogen, it is preferable to dispose a capacitor protective film having a hydrogen barrier function over the ferroelectric capacitor. In a ferroelectric capacitor having a MOS transistor, a gate length of which is equal to or longer than 0.35 µm, an aluminum oxide (hereinafter called "ALO") film deposited by sputtering has been used generally as a capacitor protective film.

By setting a density of an ALO film covering the ferroelectric capacitor equal to or higher than 3.0 $g/cm^3$, it is possible to prevent the electrical properties of the ferroelectric capacitor from being degraded even if heat treatment in a reductive atmosphere is performed (Japanese Laid-open Patent Publication No. 2001-44375). An ALO film is formed by RF sputtering, ECR sputtering or inductively coupled RF plasma enhanced sputtering, using an aluminum target. While the ALO is formed by sputtering, hydrogen will not be generated so that the ferroelectric capacitor is not degraded while the ALO film is formed.

Annealing is performed after a ferroelectric capacitor is covered with a first-layer ALO film (Japanese Laid-open Patent Publication No. 2002-94021). An interlayer insulating film is formed on the first-layer ALO film, and a local wiring is formed on the interlayer insulating film. The local wiring is connected to an upper electrode of the ferroelectric capacitor via an opening formed through the first-layer ALO film and the interlayer insulating film.

A second-layer ALO film is formed on the local wiring. By forming the two or more than two ALO films, it is possible to prevent the ferroelectric capacitor from being degraded while multi wiring layers are formed. It is possible to prevent the imprint characteristics inherent to a ferroelectric memory from being degraded.

For a ferroelectric memory of the next generation having a MOS transistor, a gate length of which is about 0.18 µm, a stack capacitor structure is adopted to improve an integration degree. The "stack capacitor structure" means the structure that one impurity diffusion region of a MOS transistor is directly connected to a lower electrode of a ferroelectric capacitor via a conductive plug formed through an interlayer insulating film in a thickness direction.

In order to realize extremely high integration, it is desired to etch the layers from an upper electrode to a lower electrode of a ferroelectric capacitor in one etching process. This one etching process results in a large aspect ratio of a lamination structure of the layers from the upper electrode to the lower electrode of the dielectric capacitor. It is apprehended that a conventional ALO film formed by sputtering has insufficient coverage (step coverage) of a step of a ferroelectric capacitor having a large aspect ratio.

Step coverage is able to be improved if an ALO film is formed by chemical vapor deposition (CVD). An ALO film is able to be formed by atomic layer deposition (ALD) which is one type of CVD. In forming an ALO film by ALD, trimethylaluminum (TMA) is generally used as aluminum source material, and water ($H_2O$) is used as oxidant.

First, water is adsorbed to the surface of a substrate, and unnecessary water is purged by evacuating the inside of a chamber. Next, TMA is supplied onto the substrate to make TMA react with OH groups and form $Al_2O_3$ of one atomic layer. Redundant TMA is purged by evacuating the inside of the chamber. An ALO film is formed by repeating a set of these cycles.

As an ALO film to be used as a protective film for a ferroelectric capacitor is formed by the above-described method, moisture and hydrogen are adsorbed in the ferroelectric film. Alternatively, hydrogen remained in the ALO film reduces the ferroelectric film in a subsequent process. The ferroelectric capacitor is therefore degraded and does not function as a memory in some cases.

An ALO film may be formed by using TMA and ozone ($O_3$) (Japanese Laid-open Patent Publication No. 2004-193280). Since $O_3$ not containing hydrogen is used as oxidant for TMA, hydrogen is prevented from being adsorbed in the ferroelectric film and remaining in the ALO film. It is therefore possible to prevent the ferroelectric capacitor from being degraded.

An ALO film is formed on an interlayer insulating film having a planarized surface (Japanese Laid-open Patent Publication No. 2006-49795). Since the surface of the layer below the ALO film has no step, even an ALO film formed by sputtering and having low step coverage is able to demonstrate sufficient barrier performance against water and hydrogen. It is possible to alleviate difficulty of etching an ALO film by forming the ALO film divided into several ALO films.

SUMMARY

According to an aspect of the invention, there is provided a manufacture method for a semiconductor device including:

forming a ferroelectric capacitor over a semiconductor substrate, the ferroelectric capacitor including a lower electrode, a ferroelectric film and an upper electrode stacked in an order recited;

forming a first capacitor protective film of aluminum oxide having a thickness equal to or thicker than 30 nm, the first capacitor protective film covering the ferroelectric capacitor; and forming a first insulating film of silicon oxide on the first capacitor protective film by chemical vapor deposition using high density plasma.

According to another aspect of the invention, there is provided a manufacture method for a semiconductor device including:

forming a ferroelectric capacitor over a semiconductor substrate, the ferroelectric capacitor comprising a lower electrode, a ferroelectric film and an upper electrode stacked in an order recited;

forming a first capacitor protective film of aluminum oxide, the first capacitor protective film covering the ferroelectric capacitor;

forming a seventh insulating film of silicon oxide having a thickness equal to or thicker than 300 nm over the first capacitor protective film by plasma enhanced chemical vapor deposition using tetraethoxysilane-containing gas as source gas; and forming a first insulating film of silicon oxide over the seventh insulating film by chemical vapor deposition using high density plasma.

According to still another aspect of the invention, there is provided a manufacture method for a semiconductor device including:

forming a ferroelectric capacitor over a semiconductor substrate, the ferroelectric capacitor including a lower electrode, a ferroelectric film and an upper electrode stacked in an order recited;

forming a first capacitor protective film of aluminum oxide, the first capacitor protective film covering the ferroelectric capacitor; and forming a first insulating film of silicon oxide over the first capacitor protective film by chemical vapor deposition using high density plasma, wherein a thickness of the first capacitor protective film is equal to or thicker than a lower limit thickness, the lower limit thickness being defined through a process comprising:

preparing samples, each of the samples comprising a substrate, a Ti film on the substrate, an aluminum oxide film on the Ti film, and a silicon oxide film on the aluminum oxide film, the aluminum oxide film being formed in a same way as the first capacitor protective film, the silicon oxide film being formed in a same way as the first insulating film, thicknesses of the aluminum oxide films of the samples being different from one another;

performing thermal desorption spectroscopy for the samples to obtain hydrogen desorption spectrums;

extracting some samples as first samples from the samples, each of the first samples having no peak of the hydrogen desorption spectrum in a temperature range equal to or lower than 700° C. and having a peak of the hydrogen desorption spectrum in a temperature range higher than 700° C.; and adopting, as the lower limit thickness, a thickness of the aluminum oxide film of one sample whose aluminum oxide film is thinnest among the aluminum oxide films of the first samples.

According to another aspect of the invention, there is provided a manufacture method for a semiconductor device including:

forming a ferroelectric capacitor over a semiconductor substrate, the ferroelectric capacitor including a lower electrode, a ferroelectric film and an upper electrode stacked in an order recited;

forming a first capacitor protective film of aluminum oxide, the first capacitor protective film covering the ferroelectric capacitor;

forming a seventh insulating film of silicon oxide over the first capacitor protective film by plasma enhanced chemical vapor deposition using tetraethoxysilane-containing gas as source gas; and forming a first insulating film of silicon oxide over the seventh insulating film by chemical vapor deposition using high density plasma, wherein a thickness of the seventh insulating film is equal to or thicker than a lower limit thickness, the lower limit thickness being defined through a process comprising:

preparing samples, each of the samples comprising a substrate, a Ti film on the substrate, an aluminum oxide film having a thickness of 20 nm on the Ti film, a first silicon oxide film on the aluminum oxide film, and a second silicon oxide film on the first silicon oxide film, the aluminum oxide film being formed in a same way as the first capacitor protective film, the first silicon oxide film being formed in a same way as the seventh insulating film, the second silicon oxide film being formed in a same way as the first insulating film, thicknesses of the first silicon oxide films of the samples being different from one another;

performing thermal desorption spectroscopy for the samples to obtain hydrogen desorption spectrums;

extracting some samples as first samples from the samples, each of the first samples having no peak of the hydrogen desorption spectrum in a temperature range equal to or lower than 700° C. and having a peak of the hydrogen desorption spectrum in a temperature range higher than 700° C.; and adopting, as the lower limit thickness, a thickness of the first silicon oxide film of one sample whose first silicon oxide film is thinnest among the first silicon oxide films of the first samples.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 4A and 4B are diagrams illustrating cross sectional structures of evaluation samples, and FIG. 4C is a graph illustrating results of thermal desorption spectroscopy of the evaluation samples illustrated in FIGS. 4A and 4B;

DESCRIPTION OF EMBODIMENTS

As ferroelectric memories are miniaturized, a gap between adjacent ferroelectric capacitors is narrowed. As a silicon oxide film is formed by plasma enhanced chemical vapor deposition (PE-CVD) using tetraethoxysilane (TEOS), void is likely to be formed in the narrowed gap between adjacent ferroelectric capacitors. As void is formed, the insulating film covering the side walls of the ferroelectric capacitor becomes thin, and a crack is formed starting from the void because of thermal expansion or the like of the upper and lower electrodes. Generation of a crack leads to a lowered reliability of wirings disposed on the insulating film.

Adopting chemical vapor deposition utilizing high density plasma generated by inductive coupling (HDP-CVD) is able to reduce generation of voids. By applying a large bias voltage to a substrate while a silicon oxide film is formed by HDP-CVD, sputtering by Ar ions and deposition of a silicon oxide film by $SiH_4$ and $O_2$ are concurrently able to occur. It is therefore possible to fill the narrow gap between ferroelectric capacitors with the insulating film. A silicon oxide film formed by HDP-CVD is represented by "HDP-SIO". Similarly, also in a multi layer wiring forming process, an HDP-SIO film having excellent burying performance is effective for an interlayer insulating film.

However, HDP-CVD induces Ar ions in the substrate and at the same time enters hydrogen ions into the substrate. When a silicon oxide film is formed on a ferroelectric capacitor by HDP-CVD, it is necessary to cover the ferroelectric capacitor with a hydrogen barrier film in order not to allow hydrogen ions to invade into the ferroelectric film. An ALO film formed by ALD is effective for a hydrogen barrier film.

It has been found, however, that as an HDP-SIO film is formed on an ALO film, the ALO film is damaged and hydrogen barrier performance is degraded. In the result, hydrogen is captured in the ferroelectric film of the ferroelectric capacitor covered with the ALO film, and the electrical characteristics of the capacitor are degraded.

Prior to describing the semiconductor device manufacture methods of embodiments, description will be made on first to tenth evaluation experiments made by the present inventor.

Figure 1A:
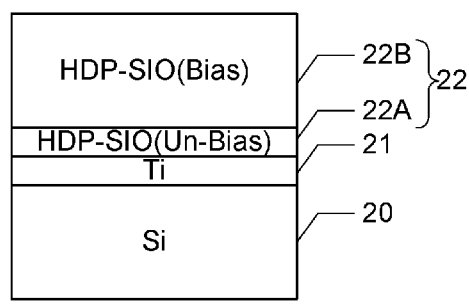
FIGS. 1A and 1B are diagrams illustrating cross sectional structures of evaluation samples.
Figure 1B:
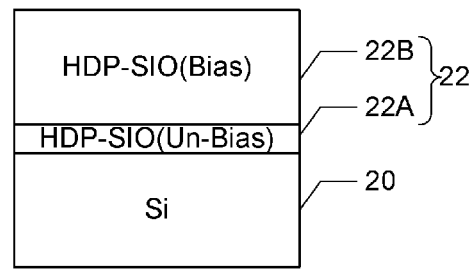

FIGS. 1A and 1B are cross sectional views of samples manufactured for the first evaluation experiment. As illustrated in FIG. 1A, a Ti film 21 as a hydrogen absorption film having a thickness of 100 nm was formed on a silicon substrate 20 by DC sputtering. The conditions of forming the Ti film 21 are as follows:

Substrate temperature 150° C.
DC power 1400 W
Ar gas flow rate 50 sccm

A silicon oxide (HDP-SIO) film 22 having a thickness of 500 nm was formed on the Ti film 21 by HDP-CVD.

Figure 18:
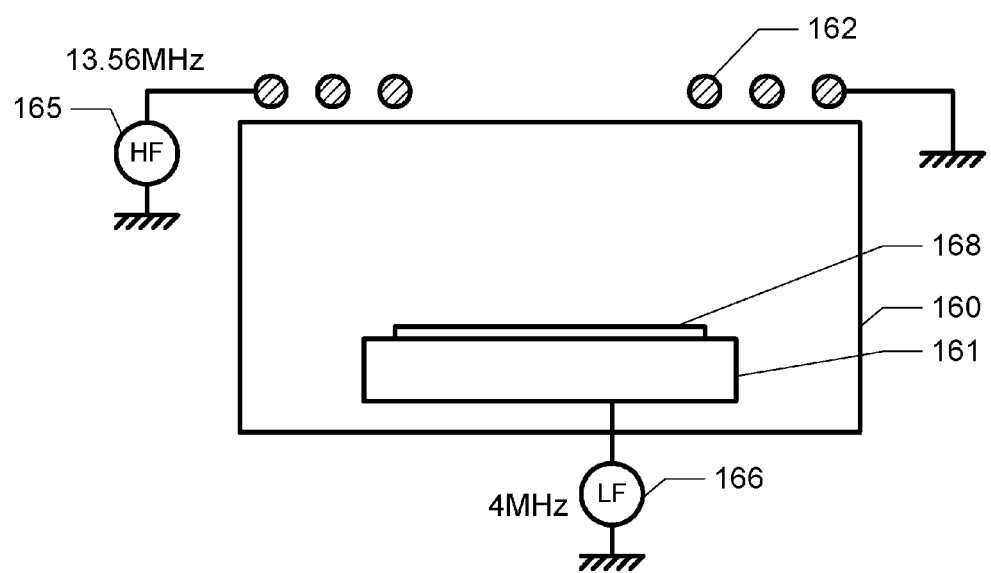
FIG. 18 is a schematic diagram illustrating a high density plasma CVD system.

FIG. 18 is a schematic diagram of an HDP-CVD system. A susceptor 161 is placed in a chamber 160. A substrate 168 on which a thin film is to be formed is disposed on the susceptor 161. A coil 162 is placed above the chamber 160. A high frequency power at a frequency of 13.56 MHz is supplied from a high frequency power source 165 to the coil 162. Inductively coupled plasma is therefore generated in the chamber 160. A bias power at a frequency of 4 MHz is supplied from a bias power source 166 to the susceptor 161. As the bias power is supplied to the susceptor 161, a bias field is generated to move charged particles in the plasma toward the substrate 168.

An HDP-SIO film 22 is formed by depositing an HDP-SIO film 22A having a thickness of 50 nm without supplying a bias power (in an unbiased state), and thereafter depositing an HDP-SIO film 22B having a thickness of 450 nm by supplying a bias power of 2400 W. Since a diameter of the substrate used is about 200 mm, a bias power per unit area is about 7.6 $W/cm^2$. The other film forming conditions are as follows:

Substrate temperature 250° C.
High frequency power for inductively coupled plasma 3500 W
$SiH_4$:Ar:$O_2$ flow rates 70 sccm:420 sccm:525 sccm
Pressure 2.0 Pa (15 mTorr)

As illustrated in FIG. 1B, another sample was also prepared by forming an HDP-SIO film 22 directly on a silicon substrate 20 without forming the Ti film.

Figure 1C:
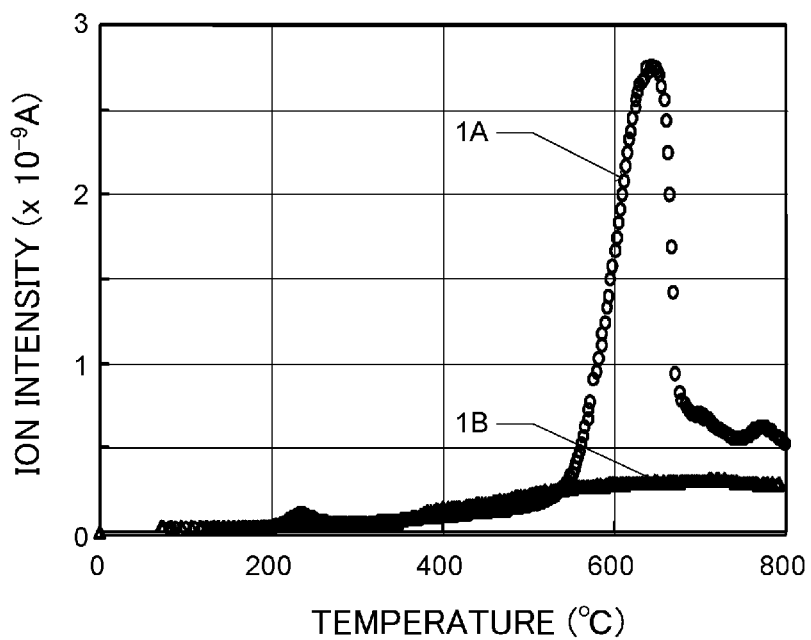
FIG. 1C is a graph illustrating results of thermal desorption spectroscopy of the evaluation samples illustrated in FIGS. 1A and 1B.

FIG. 1C illustrates analysis results by a thermal desorption spectroscopy (TDS). The analyzed sample was prepared by cutting a silicon substrate formed with films thereon into a square chip having a side length of 1 cm. Samples manufactured for evaluation experiments illustrated in FIGS. 2A to 10B have also the same size. The abscissa of FIG. 1C represents a temperature in the unit of "° C.", and the ordinate represents a hydrogen ion intensity in the unit of "A". Circle symbols 1A and triangle symbols 1B in FIG. 1C indicate TDS measurement results of the samples illustrated in FIGS. 1A and 1B, respectively. A graph obtained by TDS analysis is called "hydrogen desorption spectra". A temperature of the abscissa indicates a temperature of the stage holding a sample, and is not necessarily coincident with a temperature of a sample surface.

A peak of the hydrogen desorption spectrum was not observed for the sample illustrated in FIG. 1B and not formed with the Ti film. A peak was observed at a temperature adjacent to 650° C. for the sample illustrated in FIG. 1A and formed with the Ti film. This is because H atoms absorbed in the Ti film 21 as Ti—H groups are desorbed as hydrogen molecules. It is considered that this hydrogen was absorbed in the Ti film 21 when the HDP-SIO film 22 was formed. For example, in a device having the structure that the Ti film 21 is replaced with a PZT film, it is considered that as an HDP-SIO film is formed on the PZT film, hydrogen is captured in the PZT film.

Figure 2A:
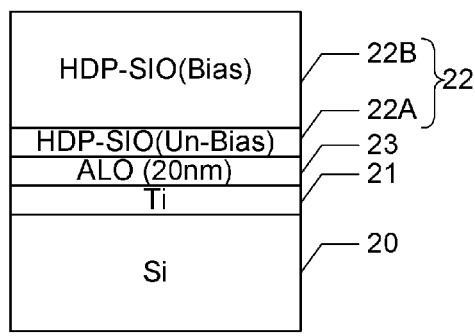
FIGS. 2A and 2B are diagrams illustrating cross sectional structures of evaluation samples.
Figure 2B:
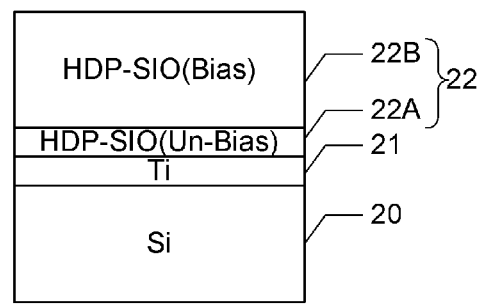

FIGS. 2A and 2B are cross sectional views of samples manufactured for the second evaluation experiment. As illustrated in FIG. 2A, a Ti film 21 having a thickness of 100 nm was formed on a silicon substrate 20 in the same way as that of the sample illustrated in FIG. 1A. An ALO film 23 having a thickness of 20 nm was formed on the Ti film 21. Samples 2Aa and 2Ab were manufactured, an ALO film 23 of the sample 2Aa being formed by RF sputtering using an aluminum oxide target, and an ALO film 23 of the sample 2Ab being formed by ALD. It is considered that a denser film is formed by adopting ALD. The film forming conditions by RF sputtering are as follows:

Substrate temperature room temperature
RF power 2000 W
Ar gas flow rate 20 sccm
In forming a film by ALD, TMA of liquid at a normal temperature was used as Al source material. Since TMA has a relatively high vapor pressure, TMA is heated to 40° C. and introduced into an ALD film forming chamber in a state that TMA is gasified by vapor pressure. For ALD film formation, a deposition process in which TMA is supplied and an oxidation process in which $O_2$ and $O_3$ are supplied were alternately executed by inserting a vacuum purge process between the deposition process and the oxidation process, with repetition of 200 cycles.

The conditions of the deposition process by ALD are as follows:
Substrate temperature 250° C.
Gas pressure 40 Pa
TMA gas flow rate 100 sccm
$O_2+O_3$ gas flow rate 0 slm
Time 5 sec The conditions of the oxidation process by ALD are as follows:
Substrate temperature 250° C.
Gas pressure 133 Pa
TMA gas flow rate 0 sccm
$O_2+O_3$ gas flow rate 10 slm
Time 15 sec An HDP-SIO film 22 having a thickness of 500 nm was formed on the ALO film 23 in the same way as that of the sample illustrated in FIG. 1A.

As illustrated in FIG. 2B, another sample was also prepared by forming an HDP-SIO film 22 directly on the Ti film 21 without forming the ALO film.

Figure 2C:
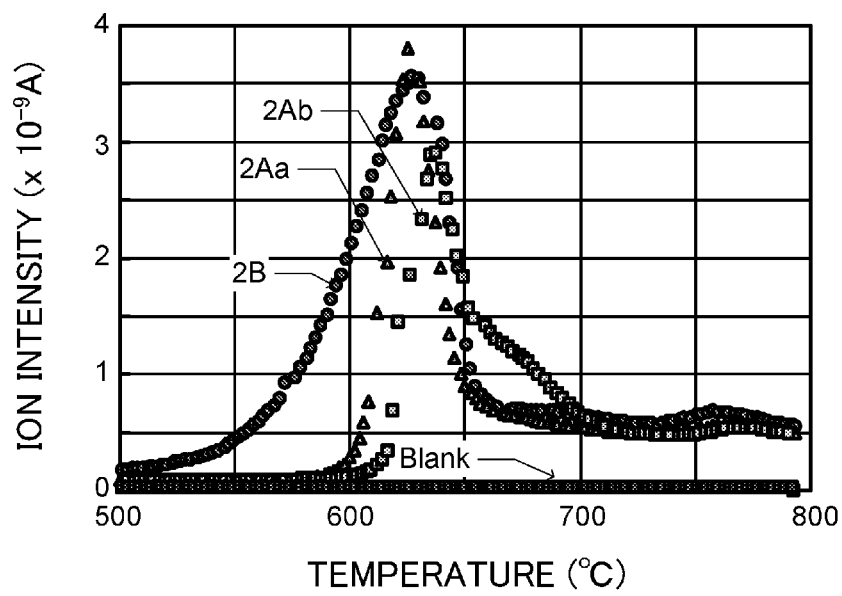
FIG. 2C is a graph illustrating results of thermal desorption gas spectroscopy of the evaluation samples illustrated in FIGS. 2A and 2B.

FIG. 2C illustrates TDS analysis results of the samples illustrated in FIGS. 2A and 2B. Triangle symbols 2Aa and square symbols 2Ab in FIG. 2C indicate TDS analysis results of the samples whose ALO film 23 illustrated in FIG. 2A are formed by RF sputtering and ALD, respectively. "Blank" in FIG. 2C indicate a background level of a TDS analysis apparatus. An area between a desorption spectrum and background level corresponds to an amount of hydrogen absorption. An amount of hydrogen absorption of the sample illustrated in FIG. 2B is larger than those of two samples illustrated in FIG. 2A.

However, temperatures of spectrum peaks of the hydrogen desorption for all the samples illustrated in FIGS. 2A and 2B are almost the same, namely about 630° C. This means that the ALO film 23 has hardly a diffusion preventive function with respect to hydrogen. The reason why the hydrogen diffusion preventive function of the ALO film 23 is lost may be ascribed to that the whole region of the ALO film 23 from the upper to lower surfaces thereof is damaged while the HDP-SIO film 22 is formed.

From comparison between the hydrogen desorption spectra of two samples whose ALO films 23 illustrated in FIG. 2A were formed in different ways, a peak of the sample 2Ab formed by ALD is observed slightly on a high temperature side as illustrated in FIG. 2C. This indicates that the ALO film 23 formed by ALD is a denser film. However, it can be understood that the whole region of the ALO film 23 formed by ALD from the upper to lower surfaces thereof is also damaged while the HDP-SIO film 22 is formed.

Figure 3A:
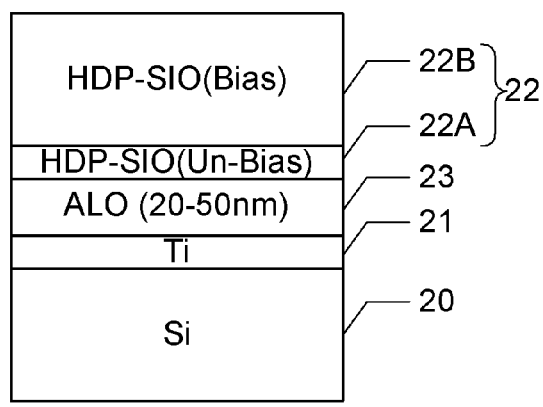
FIG. 3A is a diagram illustrating a cross s sectional structure of an evaluation sample.

FIG. 3A is a cross sectional view illustrating a sample manufactured for the third evaluation experiment. Only a thickness of the ALO film 23 is different from that of the samples illustrated in FIG. 2A, and the other structures are the same as those of the samples illustrated in FIG. 2A. Four samples were manufactured, thicknesses of the ALO film 23 of the four samples being 20 nm, 30 nm, 40 nm and 50 nm, respectively. The ALO films 23 were formed by RF sputtering.

Figure 3B:
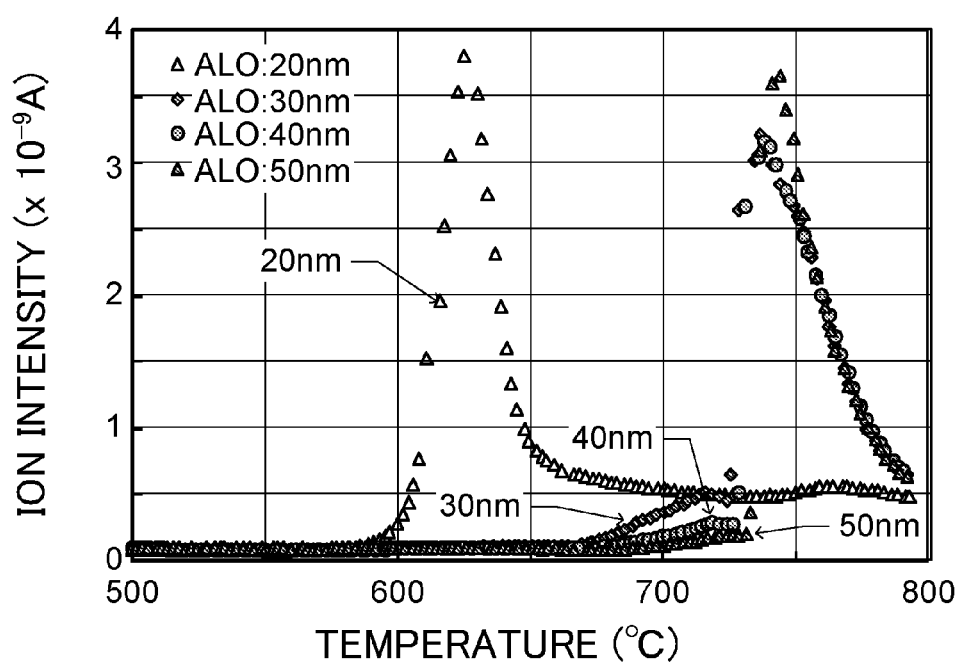
FIG. 3B is a graph illustrating results of thermal desorption spectroscopy of evaluation samples of four samples having different ALO film thicknesses.

FIG. 3B illustrates the TDS analysis result of each sample. In FIG. 3B, white triangle symbols, rhomboid symbols, circle symbols, grey triangle symbols represent hydrogen desorption spectra of samples having thicknesses of the ALO films 23 of 20 nm, 30 nm, 40 nm and 50 nm, respectively. Similar to the sample 2A illustrated in FIG. 2C, a peak of the hydrogen desorption spectrum of the sample whose ALO film 23 has a thickness of 20 nm appears at a temperature adjacent to 625° C. In contrast, as a thickness of the ALO film 23 is set equal to or thicker than 30 nm, a peak of the hydrogen desorption spectrum does not appear at a temperature adjacent to 625° C., but appears at a temperature adjacent to 740° C. The reason why a peak of the hydrogen desorption spectrum moves toward the high temperature side may be ascribed to that the ALO film 23 has a hydrogen diffusion preventive function.

It can be seen from the analysis results illustrated in FIG. 3B that as a thickness of the ALO film 23 is set equal to or thicker than 30 nm, damages do not reach the bottom of the ALO film 23, and a portion of the ALO film 23 on the substrate side maintains the hydrogen diffusion preventive function. If the HDP-SIO film is formed on the ALO film, it is preferable to set a thickness of the ALO film equal to or thicker than 30 nm in order to retain the hydrogen diffusion preventive function. It has been confirmed from experiments that particularly if a bias power is equal to or smaller than 7.6 $W/cm^2$ when the HDP-SIO film is formed on the ALO film, a sufficient hydrogen diffusion preventive function is able to be maintained by setting a thickness of the ALO film equal to or thicker than 30 nm.

FIGS. 4A and 4B are cross sectional views of samples manufactured for the fourth evaluation experiment. The sample illustrated in FIG. 4A is obtained by forming the HDP-SIO film 22 illustrated in FIG. 2A without supplying a bias power over the whole thickness thereof. Therefore, only a HDP-SIO film 22A having a thickness of 500 nm and formed in an un-bias condition is disposed on the ALO film 23. The ALO film 23 was formed by ALD. The sample illustrated in FIG. 4B is obtained by forming the HDP-SIO film 22A directly on the Ti film 21 in an un-bias condition without forming the ALO film 23 of the sample illustrated in FIG. 4A.

FIG. 4C illustrates TDS analysis results of the samples illustrated in FIGS. 4A and 4B. In FIG. 4C, square symbols and circle symbols indicate analysis results of the samples illustrated in FIGS. 4A and 4B, respectively. The inventor formed initially the hypothesis that the reason why the ALO film is damaged while the HDP-SIO film is formed is ascribed to that charged particles in plasma are attracted by a bias power toward the substrate side and collide upon the ALO film. If this hypothesis is correct, it is considered that if the HDP-SIO film is formed on the ALO film without supplying a bias power, the ALO film is not damaged.

However, the analysis results illustrated in FIG. 4C indicates that the sample illustrated in FIG. 4A has also a peak in its hydrogen desorption spectrum at a temperature adjacent to 625° C. This means that even if a bias power is not supplied while the HDP-SIO film is formed, the underlying ALO film is damaged. It has been found that as the HDP-SIO film is formed on the ALO film having a thickness of 20 nm, the ALO film is damaged and the hydrogen diffusion preventive function is lost whether the bias is applied or not while the HDP-SIO film is formed.

This evaluation result suggests that even an ALO film having a thickness of 20 nm is disposed between the PZT film and HDP-SIO film when the HDP-SIO film is formed on the PZT film, substantial amount of hydrogen is invaded into the PZT film.

Figure 5A:
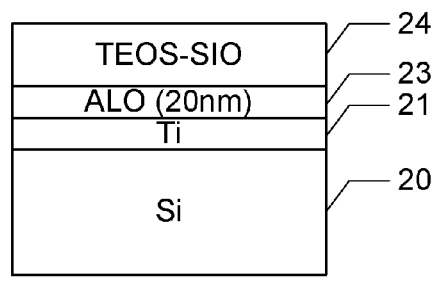
FIGS. 5A and 5B are diagrams illustrating cross sectional structures of evaluation samples.
Figure 5B:
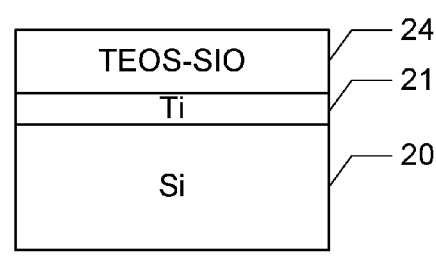

FIGS. 5A and 5B are cross sectional views of samples manufactured for the fifth evaluation experiment. The sample illustrated in FIG. 5A has a lamination structure that a Ti film 21 having a thickness of 100 nm, an ALO film 23 having a thickness of 20 nm and a silicon oxide film 24 having a thickness of 500 nm are stacked in this order on a silicon substrate 20. The methods for forming the Ti film 21 and ALO film 23 are the same as those for forming the films of the sample illustrated in FIG. 4A.

The silicon oxide film 24 is formed by plasma enhanced CVD using capacitively coupled plasma of TEOS and $O_2$. The film was formed without supplying a bias power to the susceptor holding the substrate. Silicon oxide formed by plasma enhanced CVD using capacitively coupled plasma of TEOS and $O_2$ is represented by "TEOS-SIO". The conditions of forming the TEOS-SIO film 24 are as follows:

Substrate temperature 390° C.
RF power 700 W
Pressure $1.2 \times 10^3$ Pa (9 Torr)
TEOS supply amount 690 ring/min
$O_2$ flow rate 2980 sccm The sample illustrated in FIG. 5B has the structure that the ALO film 23 of the sample illustrated in FIG. 5A is omitted, and the TEOS-SIO film 24 is formed directly on the Ti film 21.

Figure 5C:
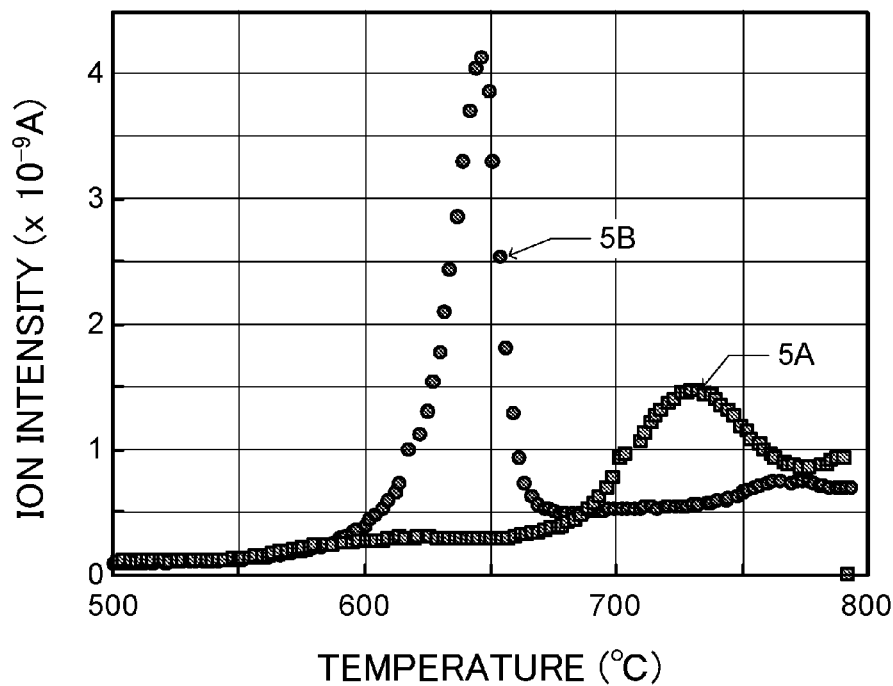
FIG. 5C is a graph illustrating results of thermal desorption spectroscopy of the evaluation samples illustrated in FIGS. 5A and 5B.

FIG. 5C illustrates TDS analysis results of the samples illustrated in FIGS. 5A and 5B. Square symbols 5A and circle symbols 5B in FIG. 5C indicate analysis results of the samples illustrated in FIGS. 5A and 5B, respectively. A hydrogen desorption spectrum of the sample 5B not including the ALO film has a peak at a temperature adjacent to 650° C. In contrast, the hydrogen desorption spectrum of the sample 5A including the ALO film 23 does not have a peak in a temperature range equal to or lower than 700° C., but has a peak at a temperature adjacent to 730° C. This indicates that the ALO film 23 of the sample illustrated in FIG. 5A has a sufficient hydrogen diffusion preventive function.

The ALO film 23 having a thickness of 20 nm maintains a sufficient hydrogen diffusion preventive function. This indicates that the ALO film 23 is not damaged while the TEOS-SIO film 24 is formed.

Figure 6A:
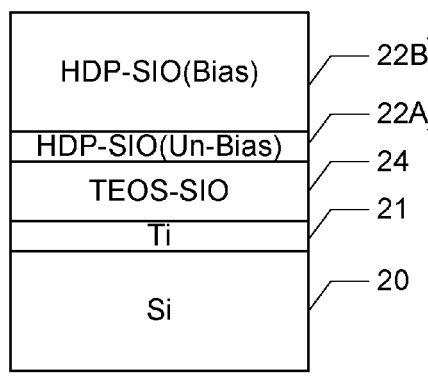
FIGS. 6A and 6B are diagrams illustrating cross sectional structures of evaluation samples.
Figure 6B:
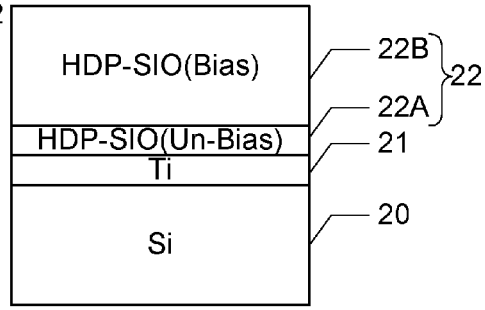

FIGS. 6A and 6B are cross sectional views of samples manufactured for the sixth evaluation experiment. The sample illustrated in FIG. 6A has a lamination structure that a Ti film 21 having a thickness of 100 nm, a TEOS-SIO film 24 having a thickness of 300 nm, an HDP-SIO film 22A having a thickness of 50 nm and formed without applying a bias and an HDP-SIO film 22B formed by applying a bias are stacked in this order on a silicon substrate 20. The methods of forming these films are the same as those of forming the films of the samples illustrated in FIGS. 2A and 5A. The sample illustrated in FIG. 6B has the structure that the TEOS-SIO film 24 of the sample illustrated in FIG. 6A is omitted.

Figure 6C:
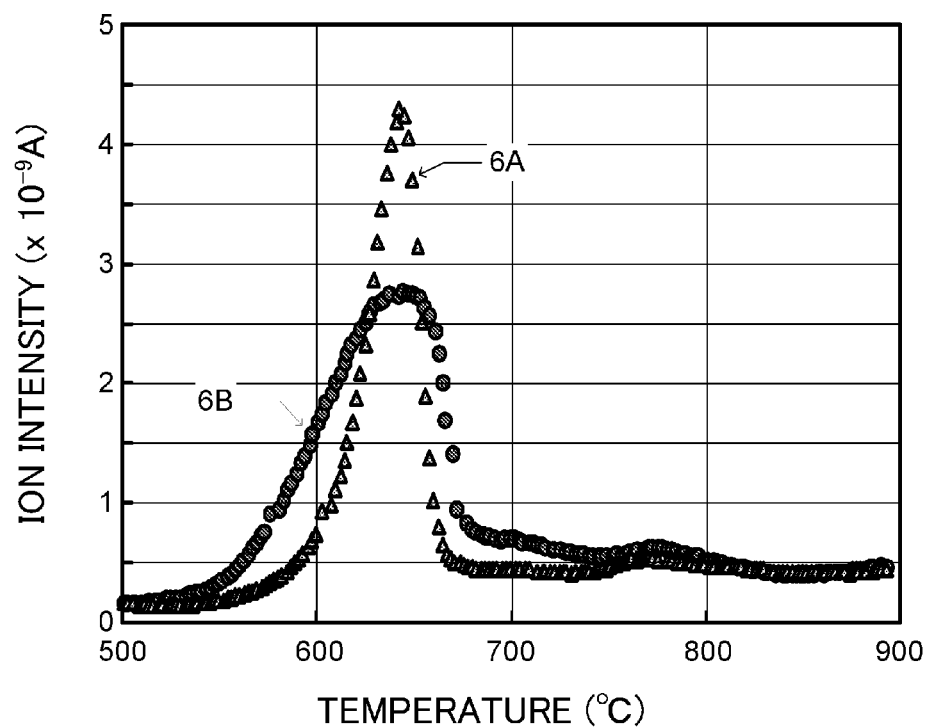
FIG. 6C is a graph illustrating results of thermal desorption spectroscopy of the evaluation samples illustrated in FIGS. 6A and 6B.

FIG. 6C illustrates TDS analysis results of the samples illustrated in FIGS. 6A and 6B. Triangle symbols 6A and circle symbols 6B indicate analysis results of the samples illustrated in FIGS. 6A and 6B, respectively. Peak positions of hydrogen desorption spectra are approximately the same for both the samples illustrated in FIGS. 6A and 6B. This evaluation result indicates that in both the samples, the TEOS-SIO film 24 has no hydrogen diffusion preventive function. It is possible to understand from this that as illustrated in FIG. 5A, even if the TEOS-SIO film 24 is placed on the ALO film 23, the hydrogen diffusion preventive function of the ALO film 23 is able to be evaluated by TDS analysis.

Figure 7A:
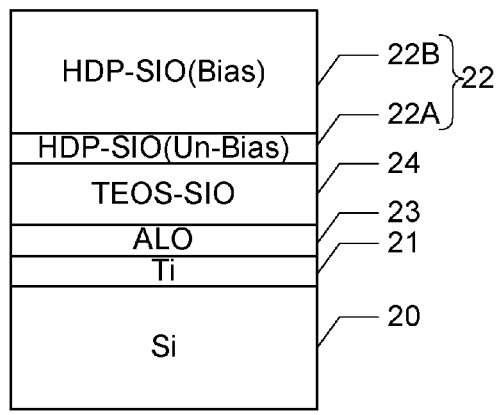
FIG. 7A is a diagram illustrating a cross s sectional structure of an evaluation sample.

FIG. 7A is a cross sectional view illustrating a sample manufactured for the seventh evaluation experiment. On and above a silicon substrate 20, a Ti film 21 having a thickness of 100 nm, an ALO film 23 having a thickness of 20 nm, a TEOS-SIO film 24, an HDP-SIO film 22A having a thickness of 50 nm and formed without applying a bias and an HDP-SIO film 22B formed by applying a bias are stacked in this order. The methods of forming these films are the same as those of forming the corresponding films of the sample illustrated in FIG. 6A. The ALO film 23 was formed by ALD. Four samples were manufactured having thicknesses of the TEOS-SIO film 24 of 50 nm, 100 nm, 300 nm and 500 nm, respectively.

Figure 7B:
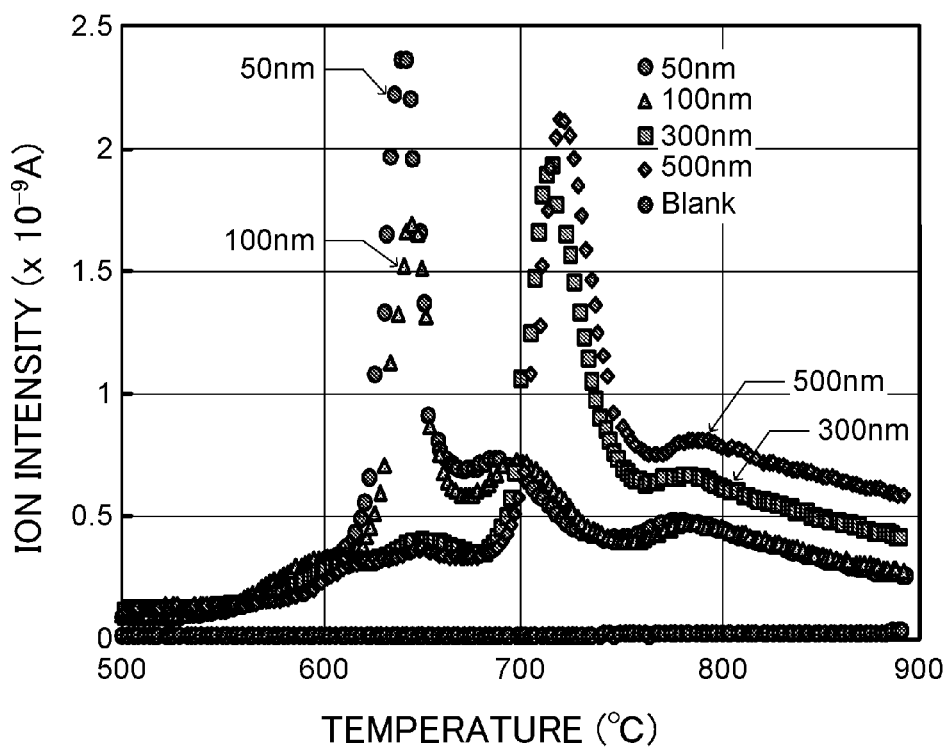
FIG. 7B is a graph illustrating results of thermal desorption spectroscopy of evaluation samples of four samples having different TEOS-SIO film thicknesses.

FIG. 7B illustrates TDS analysis results of each sample. Circle symbols, triangle symbols, square symbols and rhomboid symbols in FIG. 7B indicate analysis results of the samples having the TEOS-SIO films 24, whose thicknesses are 50 nm, 100 nm, 300 nm and 500 nm, respectively. "Blank" represents a background level of a TDS apparatus.

The samples whose TEOS-SIO films 24 have thicknesses of 50 nm and 100 nm had peaks of the hydrogen desorption spectra at a temperature adjacent to 630° C. In contrast, the samples whose TEOS-SIO films 24 have thicknesses of 300 nm and 500 nm had no peak of the hydrogen desorption spectra in the temperature range equal to or lower than 700° C., and had a peak at a temperature adjacent to 720° C. This means that in the samples whose TEOS-SIO films 24 have thicknesses of 50 nm and 100 nm, the ALO films 23 are damaged and the hydrogen diffusion preventive function is lost, whereas in the samples whose TEOS-SIO films 24 have thicknesses of 300 nm and 500 nm, the ALO film 23 maintains a sufficient hydrogen diffusion preventive function.

It is considered that the ALO film 23 having a thickness of 20 nm maintains a sufficient hydrogen diffusion preventive function because the TEOS-SIO film 24 serves as a protective film for the ALO film 23 while the HDP-SIO films 22A and 22B are formed.

As understood from the analysis results, in order to maintain the hydrogen diffusion preventive function of the ALO film 23 under the HDP-SIO film after the HDP-SIO film is formed, it is preferable to set a thickness of the TEOS-SIO film serving as a protective film to be formed on the ALO film equal to or thicker than 300 nm.

Figure 8A:
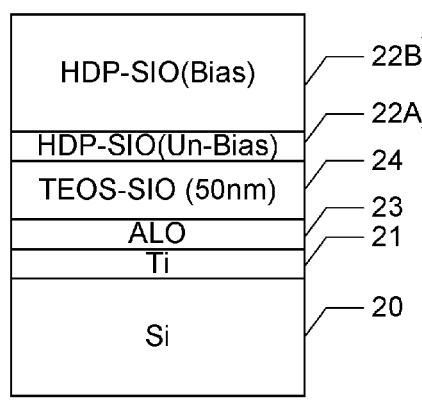
FIGS. 8A and 8B are diagrams illustrating cross sectional structures of evaluation samples.
Figure 8B:
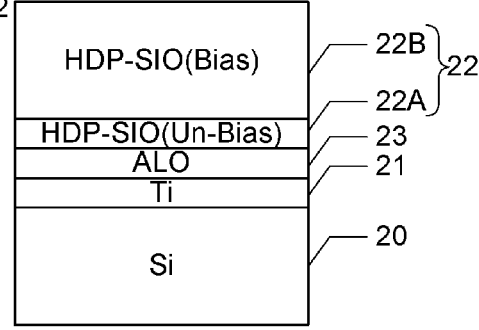
Figure 8C:
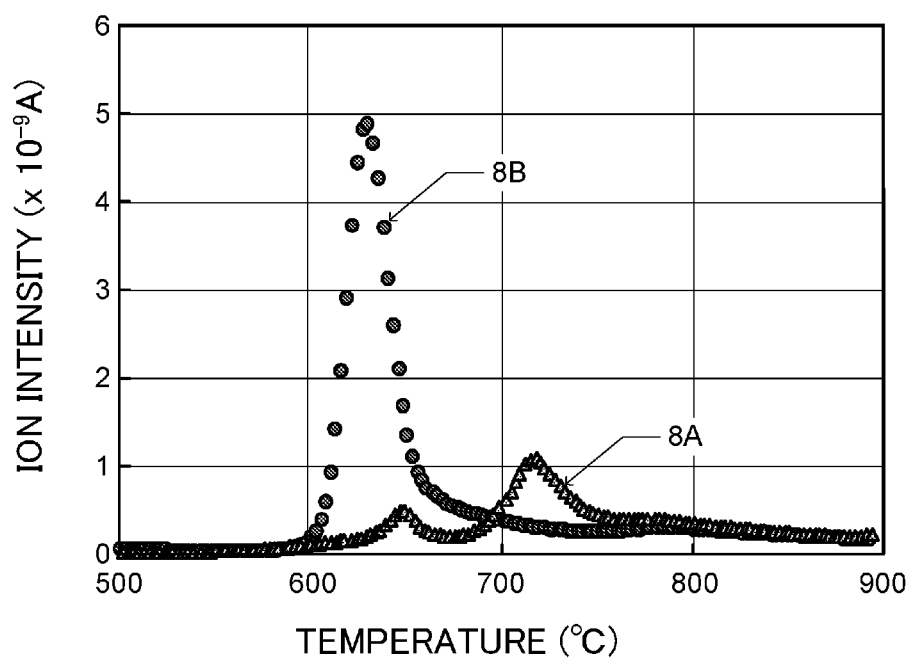
FIG. 8C is a graph illustrating results of thermal desorption spectroscopy of the evaluation samples illustrated in FIGS. 8A and 8B.

FIGS. 8A and 8B are cross sectional views of samples manufactured for the eighth evaluation experiment. The lamination structure of the sample illustrated in FIG. 8A is the same as that of the sample illustrated in FIG. 7A. However, a thickness of the TEOS-SIO film 24 was set to 50 nm, and the HDP-SIO films 22A and 22B were formed by a high density plasma CVD system different from that used for forming the sample illustrated in FIG. 7A. The conditions of forming the HDP-SIO film 22 are as follows:

Substrate temperature 370° C.
High frequency power for inductively coupled plasma 3100 W
$SiH_4$:Ar:$O_2$ flow rate 60 sccm:110 sccm:105 sccm The film forming conditions of the HDP-SIO film 22B are a bias power of 3250 W in addition to the above-described conditions.

The sample illustrated in FIG. 8B has the structure that the TEOS-SIO film 24 of the sample illustrated in FIG. 8A is omitted.

The hydrogen desorption spectrum of the sample illustrated in FIG. 8B has a peak at a temperature adjacent to 630° C. In contrast, the hydrogen desorption spectrum of the sample illustrated in FIG. 8A and disposing the ALO film 23 has a peak at a temperature adjacent to 650° C. However, an intensity of this peak is weak, and a large peak appears at a temperature adjacent to 720° C. This means that the ALO film maintains a greater hydrogen diffusion preventive function than the sample illustrated in FIG. 8B although the hydrogen diffusion function of the ALO film 23 is not sufficient.

In the samples illustrated in FIG. 7A, the sample whose TEOS-SIO film 24 has a thickness of 50 nm has a large peak of the hydrogen desorption spectrum at a temperature adjacent to 630° C. It is possible therefore to understand that a thickness of the TEOS-SIO film necessary for serving as a protective film for the ALO film depends on the film forming system and film forming conditions of the HDP-SIO film to be formed on the TEOS-SIO film.

Figure 9A:
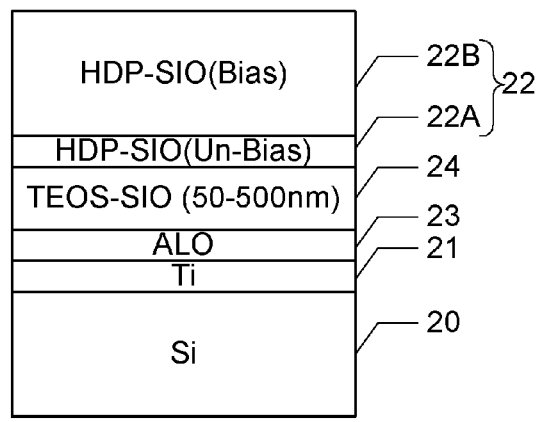
FIG. 9A is a diagram illustrating a cross s sectional structure of an evaluation sample.

FIG. 9A is a cross sectional view illustrating a sample manufactured for the ninth evaluation experiment. The lamination structure of the sample is the same as that of the sample illustrated in FIG. 8A, and only a thickness of the TEOS-SIO film 24 is different. Five samples were manufactured, whose TEOS-SIO films 24 have thicknesses of 50 nm, 100 nm, 200 nm, 300 nm and 500 nm, respectively. A high density plasma CVD system used for forming the HDP-SIO film is the same as that used for forming the HDP-SIO film of the sample illustrated in FIG. 8A. The method of forming each film is the same as that of forming a corresponding film of the sample illustrated in FIG. 8A.

Figure 9B:
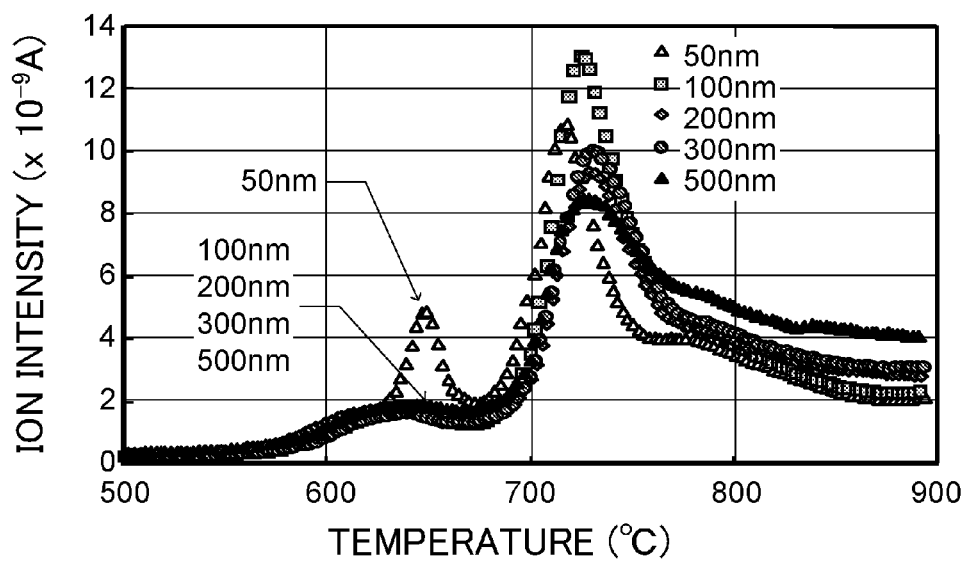
FIG. 9B is a graph illustrating results of thermal desorption spectroscopy of evaluation samples of five samples having different TEOS-SIO film thicknesses.

FIG. 9B illustrates TDS analysis results of each sample. White triangle symbols, square symbols, rhomboid symbols, circle symbols and black triangle symbols indicate analysis results of the samples whose TEOS-SIO films 24 have thicknesses of 50 nm, 100 nm, 200 nm, 300 nm and 500 nm, respectively. As a thickness of the TEOS-SIO film 24 is equal to or thicker than 100 nm, a peak of the hydrogen desorption spectrum does not appear in a temperature range equal to or lower than 700° C.

It is found that if a thickness of the TEOS-SIO film 24 is set equal to or thicker than 100 nm, it is possible to protect the ALO film 23 sufficiently in the case of using the high density plasma system used for forming the HDP-SIO film of the samples illustrated in FIGS. 8A and 9A. A thickness of the TEOS-SIO film necessary for maintaining the hydrogen diffusion preventive function of the ALO film is preferably set properly in accordance with the film forming system, film forming conditions and the like of the HDP-SIO film to be formed on the TEOS-SIO film. In the following, description will be made on a method of determining a lower limit value of a preferable thickness of the TEOS-SIO film.

A plurality of samples are manufactured having the lamination structure illustrated in FIG. 9A and different thicknesses of the TEOS-SIO film. TDS analysis is performed for each sample to measure a hydrogen desorption spectrum. If the TEOS-SIO film is too thin, the ALO film is damaged and the hydrogen diffusion preventive function is lost so that a peak of the hydrogen desorption curve appears in the temperature range equal to lower than 700° C. Samples are extracted which do not have a peak in the temperature range equal to or lower than 700° C. and have a peak in the temperature range higher than 700° C. A thickness of the TEOS-SIO film of a sample whose TEOS-SIO film is the thinnest among the extracted samples is defined as a lower film thickness limit. This lower film thickness limit corresponds to a lower limit of the preferable thickness of the TEOS-SIO film.

Figure 10A:
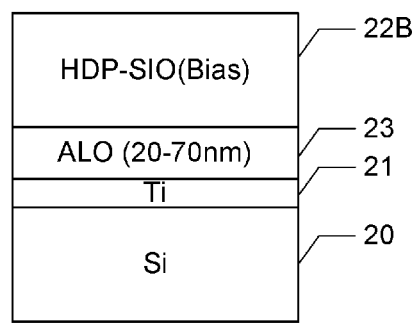
FIG. 10A is a diagram illustrating a cross s sectional structure of an evaluation sample.
Figure 10B:
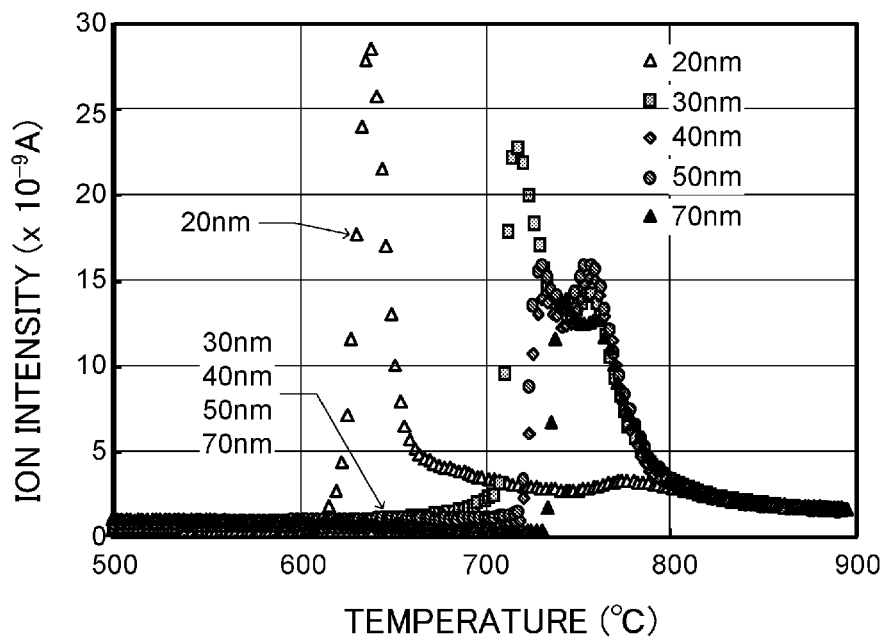
FIG. 10B is a graph illustrating results of thermal desorption spectroscopy of evaluation samples of five samples having different ALO film thicknesses.

FIG. 10A is a cross sectional view of a sample manufactured for the tenth evaluation experiment. A lamination structure consisting of a silicon substrate 20, a Ti film 21 and an ALO film 23 is the same as that of the sample illustrated in FIG. 3A. The ALO film 23 was formed by RF sputtering. An HDP-SIO film 22B having a thickness of 500 nm and formed by applying a bias is disposed on the ALO film 23. The HDP-SIO film 22B was formed by using a high density plasma CVD system different from the system used for forming the HDP-SIO film 22 of the sample illustrated in FIG. 3A. The film forming conditions are as follows:

Substrate temperature 370° C.
High frequency power for inductively coupled plasma 3100 W
Bias power 3250 W
$SiH_4$:Ar:$O_2$ flow rate 60 sccm:110 sccm:105 sccm FIG. 10B illustrates TDS analysis results of each sample illustrated in FIG. 10A. White triangle symbols, square symbols, rhomboid symbols, circle symbols and black triangle symbols indicate analysis results of the samples whose ALO films 23 have thicknesses of 20 nm, 30 nm, 40 nm, 50 nm and 70 nm, respectively. The sample whose ALO film 23 has a thickness of 20 nm has a peak of the hydrogen desorption spectrum at a temperature adjacent to 640° C., whereas the samples whose ALO films 23 have thicknesses equal to or thicker than 30 nm do not have a peak in the temperature range equal to or lower than 700° C. and have a peak that moves into the range of 720° C. to 760° C.

This evaluation results indicate that it is possible to maintain the hydrogen diffusion preventive function of the ALO film 23 by setting a thickness of the ALO film equal to or thicker than 30 nm, even if the HDP-SIO film is formed on the ALO film. Also in the evaluation experiment illustrated in FIGS. 3A and 3B, the hydrogen diffusion preventive function of the ALO film was able to be maintained by setting a thickness of the ALO film 23 equal to or thicker than 30 nm.

It is considered in a precise sense that a preferred thickness of the ALO film changes with a film forming system, film forming conditions and the like of the HDP-SIO film to be formed on the ALO film. It is however considered that if a thickness of the ALO film is set equal to or thicker than 30 nm under the generally used film forming conditions, the hydrogen diffusion preventive function of the ALO film is able to be maintained. In the above-described evaluation experiment, although the ALO film was formed by sputtering, the thickness is preferably set equal to or thicker than 30 nm also when the film is formed by CVD or ALD.

Depending upon the film forming conditions of the HDP-SIO film to be formed on the ALO film, the hydrogen diffusion preventive function may be maintained even if a thickness of the ALO film is set thinner than 30 nm. In the following, description will be made on a method of determining a lower limit value of a preferable thickness of the ALO film.

A plurality of samples are manufactured having the same lamination structure as illustrated in FIG. 10A, thicknesses of the ALO films of the samples are different from one another. TDS analysis is performed for each sample to measure a hydrogen desorption spectrum. If the hydrogen diffusion preventive function of the ALO film is lost, a peak of the hydrogen desorption spectrum appears in the temperature range equal to or lower than 700° C. Samples are extracted which do not have a peak in the temperature range equal to or lower than 700° C. and have a peak in the temperature range higher than 700° C. A thickness of the ALO film of a sample whose ALO film has the thinnest thickness among the extracted samples is defined as a lower film thickness limit. This lower film thickness limit corresponds to a lower limit of the preferable thickness of the ALO film.

Next, with reference to FIGS. 11A to 11O, description will be made on a method of manufacturing a ferroelectric memory according to the first embodiment.

Figure 11A:
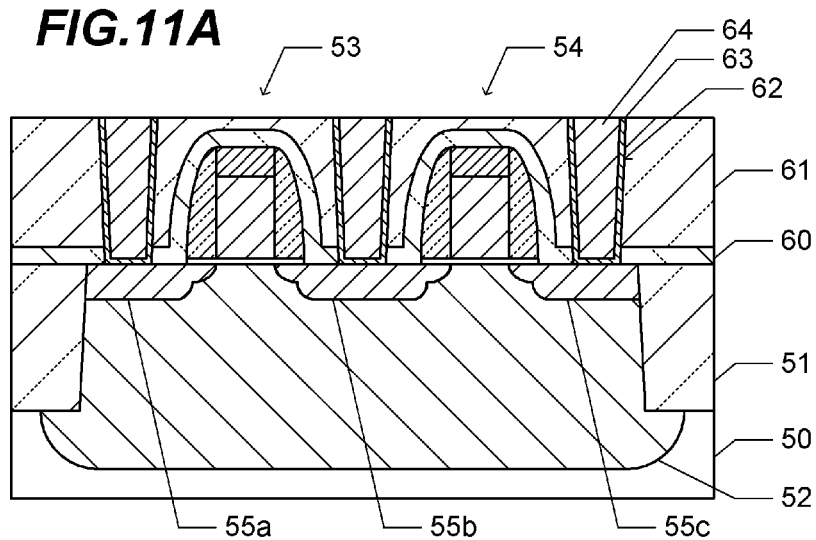
FIGS. 11A to 11O are cross sectional views of a semiconductor device during manufacture a semiconductor device manufacture method according to a first embodiment.

As illustrated in FIG. 11A, an element isolation insulating film 51 of a shallow trench isolation (STI) structure is formed in a surface layer of a substrate 50 made of silicon to thereby define active regions. A p-type well 52 is formed in a surface layer of the active region. On the surface of the p-type well 52, n-channel MOS transistors 53 and 54 are formed. Of three n-type impurity diffusion regions 55a, 55b and 55c formed in the surface layer of the p-type well 52, the impurity diffusion regions 55a and 55b constitute a source and a drain of one MOS transistor 53, and the impurity diffusion regions 55c and 55b constitute a source and a drain of the other MOS transistor 54. Namely, the impurity diffusion region 55b is shared by two MOS transistors 53 and 54. The element isolation insulating film 51, the p-type well 52 and the MOS transistors 53 and 54 are formed by well-known methods.

A cover insulating film 60 of SiON is formed on the substrate 50 to cover the MOS transistors 53 and 54. An interlayer insulating film 61 of silicon oxide is formed on the cover insulating film 60, and the surface of the interlayer insulating film 61 is planarized. Via holes 62 are formed through the interlayer insulating film 61 and the cover insulating film 60, reaching the impurity diffusion regions 55a, 55b and 55c, respectively. The inner surfaces of these via holes 62 are covered with a glue film 63, and conductive plugs 64 of tungsten are embedded in the via holes 62. The glue film 63 has a two-layer structure of, e.g., a Ti film having a thickness of 30 nm and a TiN film having a thickness of 50 nm.

The glue films 63 and conductive plugs 64 are formed by a film forming process and a chemical mechanical polishing (CMP) process. The Ti film and TiN film constituting the glue film 63 may be formed by sputtering. The W film embedded in the via hole may be formed by chemical vapor deposition (CVD).

Figure 11B:
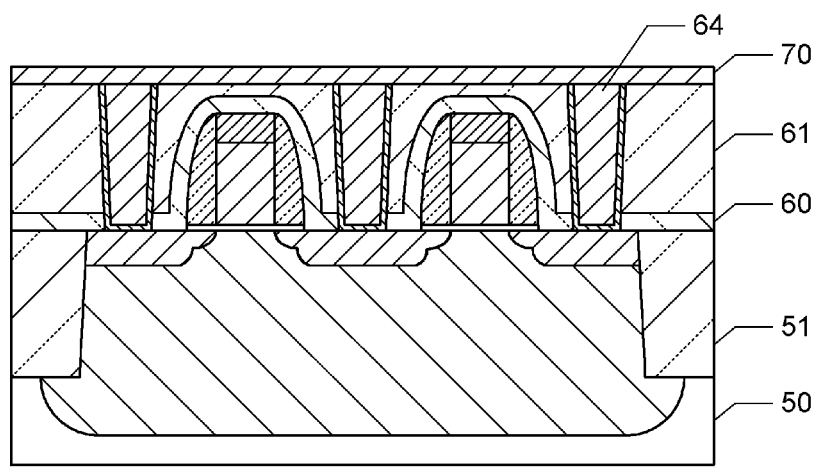

As illustrated in FIG. 11B, a Ti film 70 having a thickness of 20 nm is formed on the interlayer insulating film 61 and the conductive plugs 64 by sputtering. Since titanium is material having high self orientation, the Ti film 70 having good crystallinity is formed. The crystal structure of Ti is a hexagonal closest packing structure, and is easily oriented so as to make the (001) plane be parallel to the substrate surface.

Figure 11C:
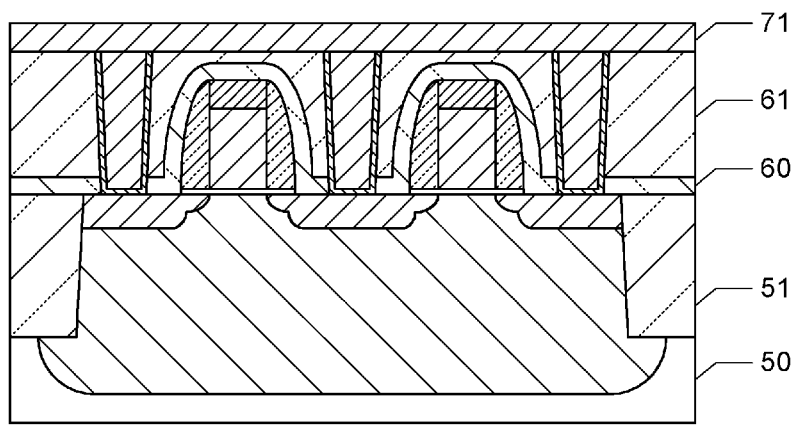

As illustrated in FIG. 11C, a rapid thermal anneal (RTA) process is executed in a nitrogen atmosphere to nitride the Ti film 70 to form a TiN film 71. By nitriding the Ti film 70 to form the TiN film 71, it is possible to enhance oxidation resistance. The RTA conditions are, for example, as follows:
Substrate temperature 650° C.
Nitrogen flow rate 10 slm (standard liter/min)
Process time 120 sec Since crystallinity of the Ti film 70 before nitriding is good, crystallinity of the TiN film 71 obtained by nitriding the Ti film 70 is also good. The crystal structure of TiN is a rock salt structure. As a <001> oriented Ti film is nitrided, a <111> oriented TiN film is obtained.

Figure 11D:
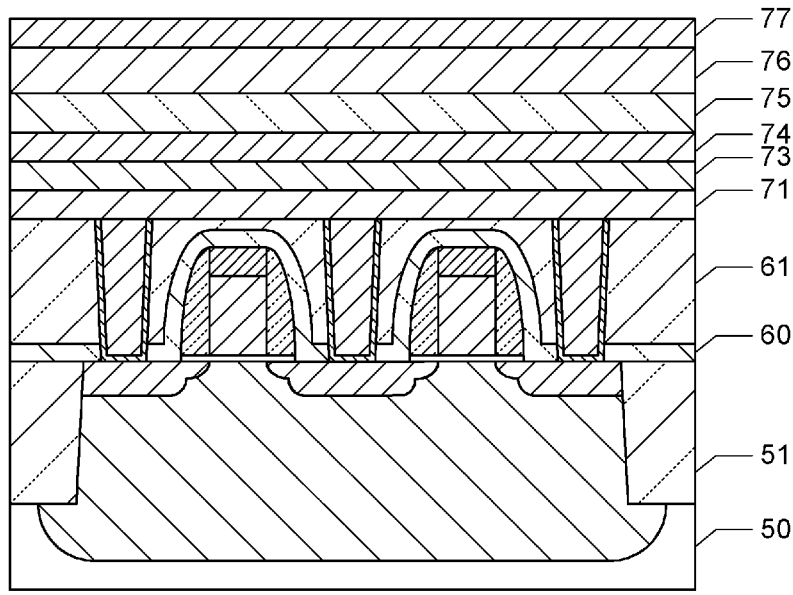

As illustrated in FIG. 11D, sequentially formed on the TiN film 71 are a TiAlN film 73 having a thickness of 100 nm, an Ir film 74 having a thickness of 100 nm, a ferroelectric film 75 having a thickness of 120 nm, an IrO film 76 having a thickness of 150 nm, and an Ir film 77 having a thickness of 100 nm. The TiAlN film 73, the Ir film 74, the IrO film 76 and the Ir film 77 are formed by sputtering. The TiAlN film 73 serves as an oxygen barrier layer.

The crystal structure of the TiAlN film 73 is a rock salt structure, and is <111> oriented inheriting orientation of the underlying TiN film 71. The crystal structure of the Ir film 74 is a face-centered cubic lattice structure, and is <111> oriented inheriting orientation of the underlying TiAlN film 73.

In the following, a method of forming the ferroelectric film 75 will be described. First, a PZT film having a thickness of 5 nm is formed by metal organic chemical vapor deposition (MOCVD). Thereafter, by raising an oxygen partial pressure, a PZT film having a thickness of 115 nm is formed by MOCVD. Film forming conditions are a substrate temperature of 620° C. and a pressure of 667 Pa (5 Torr).

It is possible to improve crystallinity of the PZT film by setting an oxygen partial pressure during an initial growth relatively low. However, as the oxygen partial pressure is lowered, oxygen defect increases and thereby leak current increases. By raising the oxygen partial pressure after the PZT film having a thickness of 5 nm is formed, it is possible to inherit good crystallinity and prevent an increase in leak current.

The ferroelectric film 75 of PZT inherits orientation of the Ir film 74, and is <111> oriented. By improving orientation (crystallinity) of the TiN film 71, it is possible to improve orientation (crystallinity) of the ferroelectric film 75.

The ferroelectric film 75 may be made of PZT based material such as PLZT, Bi layer-structured compound such as SBT, SBTN, and the like other than PZT.

Figure 11E:
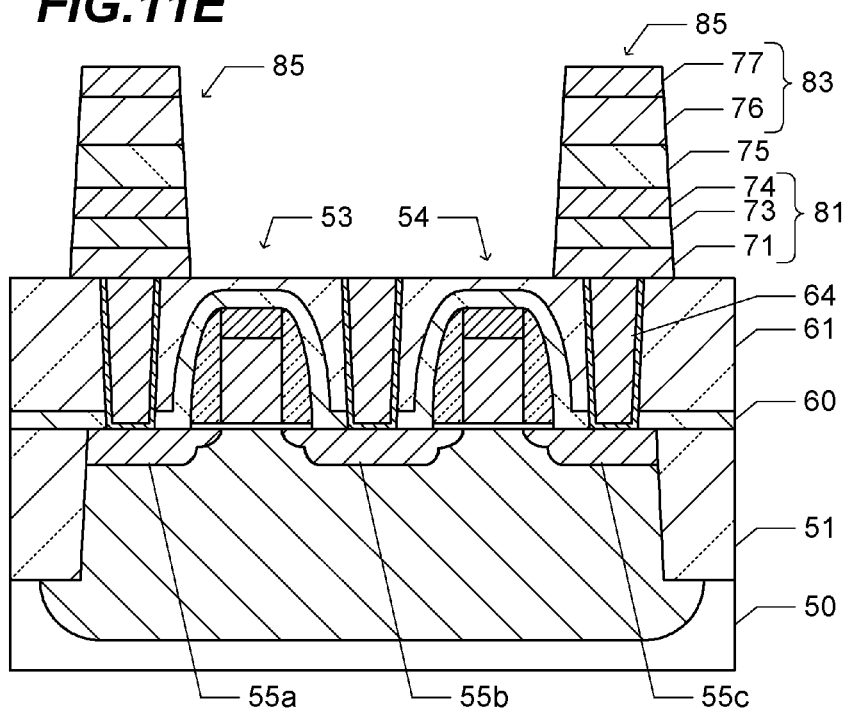

Processes up to the structure illustrated in FIG. 11E will be described. On the Ir film 77, a TiN film having a thickness of 200 nm and a TEOS-SIO film having a thickness of 700 nm are formed. These two films are used as a hard mask when the lamination structure from the Ir film 77 to the TiN film 71 is patterned. A resist pattern having a capacitor plan shape is formed on the TEOS-SIO film.

By using the resist pattern as a mask, the TEOS-SIO film serving as the hard mask is patterned by dry etching using mixture gas of $C_4F_8$, Ar and $CF_4$. Further, the TiN film serving as the hard mask is patterned by dry etching using mixture gas of $BCl_3$ and $Cl_2$, or using $Cl_2$ gas. After the TiN film is pattered, the resist pattern is removed by ashing. In consequence, the hard mask having the two-layer structure of the TiN film and the TEOS-SIO film remains.

By using the hard mask as an etching mask, each layer from the upper Ir film 77 to the lower Ir film 74 is etched in an inductively coupled plasma (ICP) type etching system. The Ir films 77 and 74 are etched using HBr, $O_2$ and $C_4F_8$. The IrO film 76 is etched using HBr and $O_2$. The ferroelectric film 75 is etched using $Cl_2$ and Ar.

Thereafter, the TEOS-SIO film used as the hard mask is removed by reactive ion etching using mixture gas of $C_4F_8$, Ar and $O_2$. Next, the TiN film used as the hard mask, TiAlN film 73 and TiN film 71 are removed using mixture liquid of hydrogen peroxide aqueous solution and ammonia aqueous solution.

A ferroelectric capacitor 85 is constituted of: a lower electrode 81 consisting of three layers of the TiN film 71, TiAlN film 73 and Ir film 74; an upper electrode 83 consisting of two layers of the IrO film 76 and Ir film 77; and the ferroelectric film 75 disposed between the upper and lower electrodes 83, 81. Since the layers from the upper electrode 83 to the lower electrode 81 of the ferroelectric capacitor 85 are patterned by one etching process (using the same etching mask), it is not necessary to ensure a position alignment margin for these patterns. Therefore, the above-described patterning method with one etching process is suitable for miniaturizing ferroelectric capacitors.

The lower electrode 81 of the ferroelectric capacitor 85 is connected to one impurity diffusion region 55a of the MOS transistor 53 via the underlying conductive plug 64. The lower electrode 81 of another ferroelectric capacitor 85 is connected to one impurity diffusion region 55c of another MOS transistor 54 via another underlying conductive plug 64.

Figure 11F:
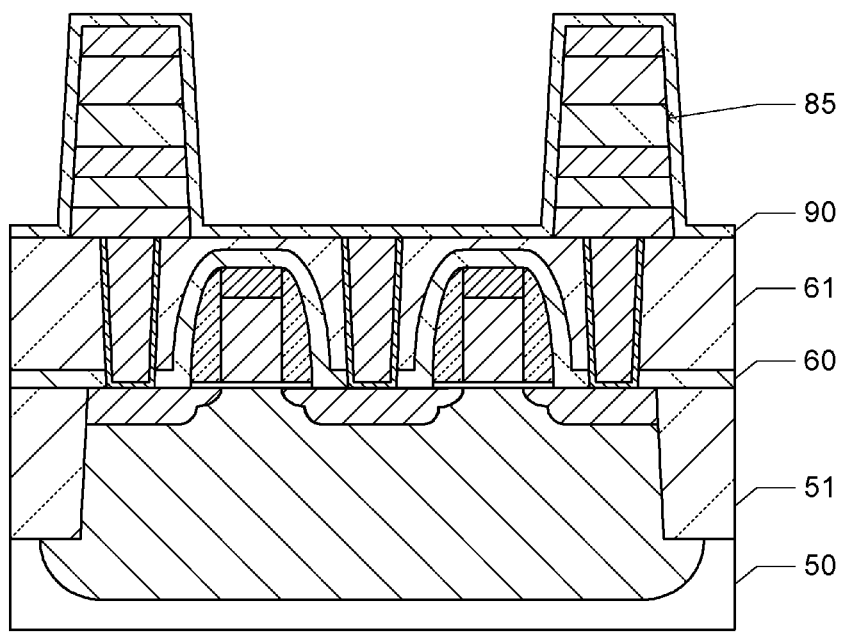

As illustrated in FIG. 11F, a capacitor protective film 90 of ALO having a thickness of 40 nm is formed by ALD on the ferroelectric capacitor 85 and the interlayer insulating film 61. In the following, description will be made on a method of forming the capacitor protective film 90.

An ALO film having a thickness of 2 nm is formed by ALD alternately supplying $O_2+O_3$ and trimethylalminum (TMA). Thereafter, oxygen recovery anneal is performed for 60 minutes at 600° C. This anneal recovers oxygen defect in the ferroelectric film 75. After the oxygen recovery anneal, an ALO film having a thickness of 38 nm is formed by ALD. In this manner, the ALO film 90 having a thickness of 40 nm is formed.

After the ALO film having a thickness of 40 nm is formed, it is difficult to recover the oxygen defect in the ferroelectric film 75 even if the oxygen recovery anneal is performed, because the ALO film serves as an oxygen barrier. By performing the oxygen recovery anneal at an intermediate stage of forming the ALO film, it is possible to recover sufficiently the oxygen defect in the ferroelectric film 75.

Since the capacitor protective film 90 is formed by ALD, it is possible to form the capacitor protective film 90 having better step coverage than the capacitor protective film is formed by sputtering.

Figure 11G:
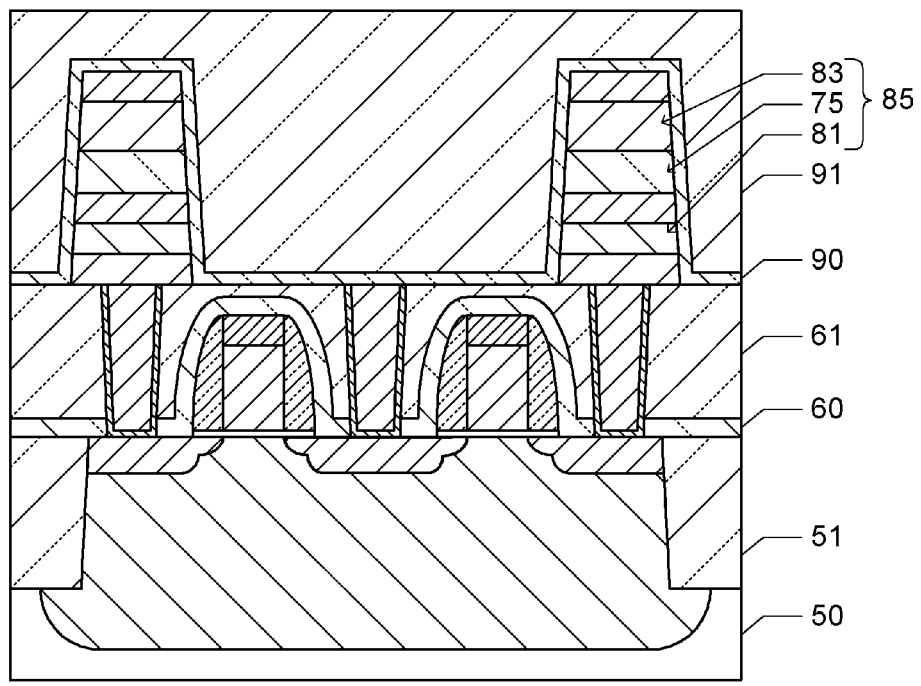

As illustrated in FIG. 11G, an interlayer insulating film 91 of HDP-SIO is formed on the capacitor protective film 90 at a substrate temperature of 250° C. Since a thickness of the capacitor protective film 90 of ALO is thicker than 30 nm, the hydrogen diffusion protective function of the capacitor protective film 90 will not be lost even if the HDP-SIO film is formed on the capacitor protective film 90. It is therefore possible to prevent the ferroelectric film 75 from being reduced while the interlayer insulating film 91 is formed.

Thereafter, the interlayer insulating film 91 is subjected to CMP to planarize the surface thereof. A remaining film thickness in the region where the ferroelectric capacitor 85 is disposed is 300 nm after CMP. The interlayer insulating film 91 is exposed to $N_2O$ plasma to perform a dehydration process.

Figure 11H:
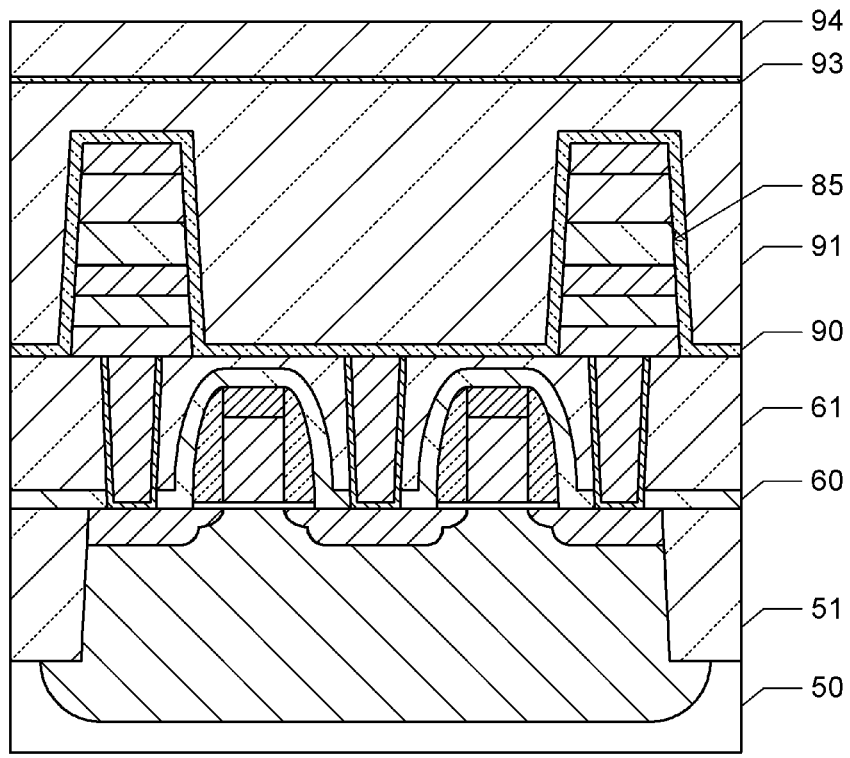

As illustrated in FIG. 11H, a flat capacitor protective film 93 of ALO having a thickness of 20 nm is formed on the dehydrated interlayer insulating film 91 by sputtering. Since the surface of the underlying interlayer insulating film 91 is planarized, it is possible to adopt sputtering having inferior step coverage as the film forming method. In order to lessen a burden on an etching process, a thinner flat capacitor film 93 may be formed by ALD. For example, a thickness of the flat capacitor protective film 93 may be set to about 10 nm.

An interlayer insulating film 94 having a thickness of 300 nm is formed on the flat capacitor protective film 93 by plasma CVD using TEOS and $O_2$. By disposing the interlayer insulating film 94 of silicon oxide, it is possible to improve reliability of wirings to be formed on the interlayer insulating film 94.

Figure 11I:
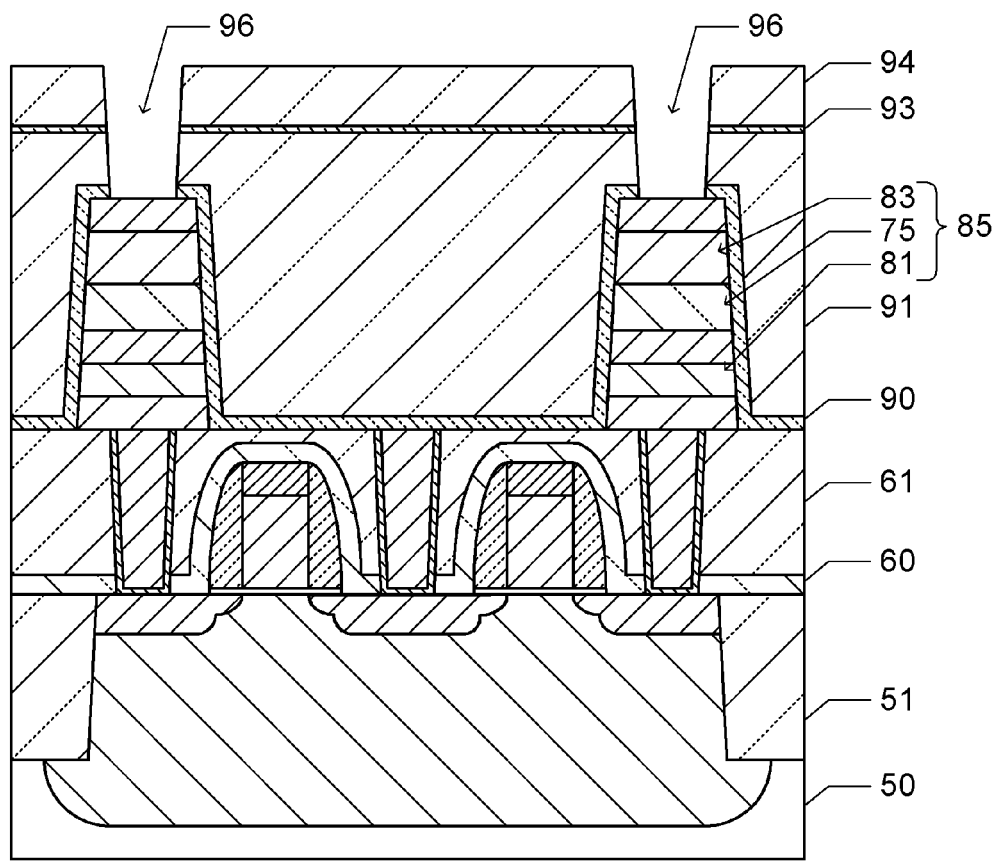

As illustrated in FIG. 11I, via holes 96 are formed through the interlayer insulating film 94, the flat capacitor protective film 93, the interlayer insulating film 91 and the capacitor protective film 90, reaching the upper electrodes 83 of the ferroelectric capacitors 85. Each layer is etched by using CF-based gas such as mixture gas of $CHF_3$, $CH_4$ and Ar. After the via holes 96 are formed, oxygen recovery anneal is performed for 60 minutes at a temperature of 500° C. in an oxygen atmosphere.

Figure 11J:
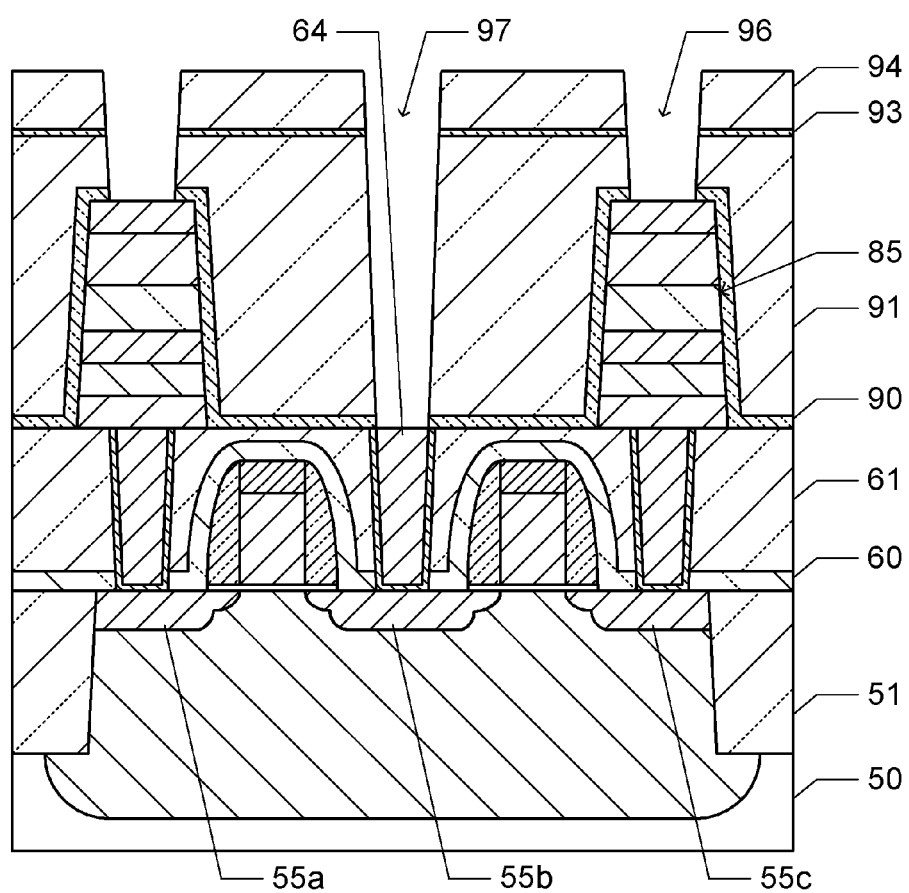

As illustrated in FIG. 11J, a via hole 97 is formed through the interlayer insulating film 94, the flat capacitor protective film 93, the interlayer insulating film 91 and the capacitor protective film 90. The via hole 97 reaches the upper surface of the conductive plug 64 connected to the impurity diffusion region 55b shared by two MOS transistors 53 and 54.

Figure 11K:
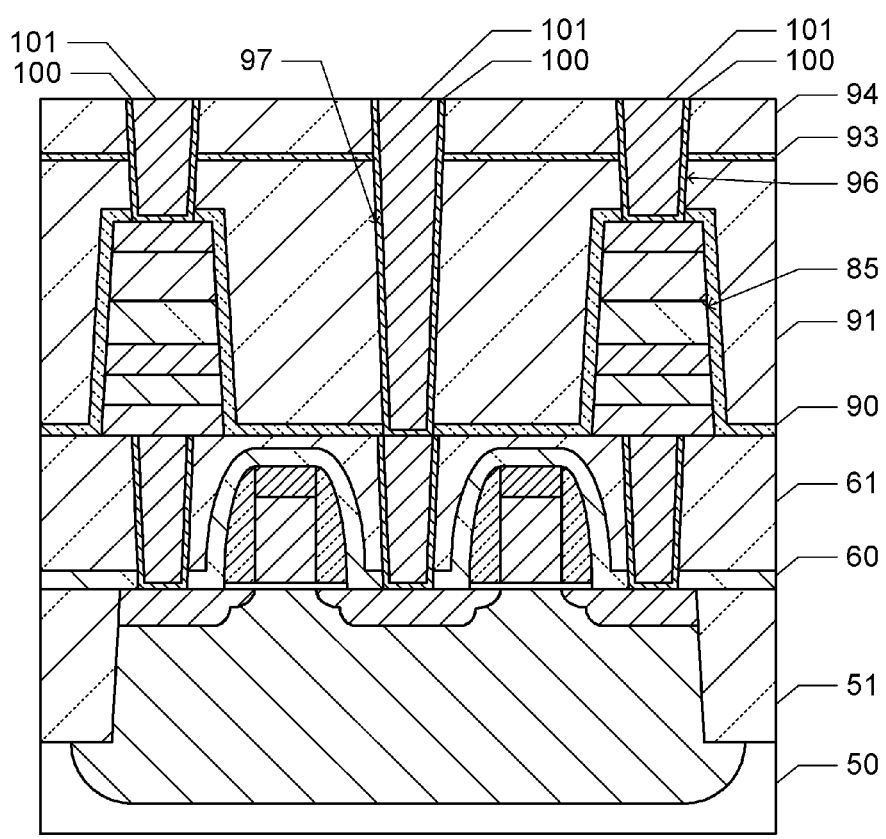

As illustrated in FIG. 11K, the inner surfaces of the via holes 96 and 97 are covered with a glue film 100 of TiN having a thickness of 100 nm. Conductive plugs 101 made of W are embedded in the via holes 96 and 97.

Figure 11L:
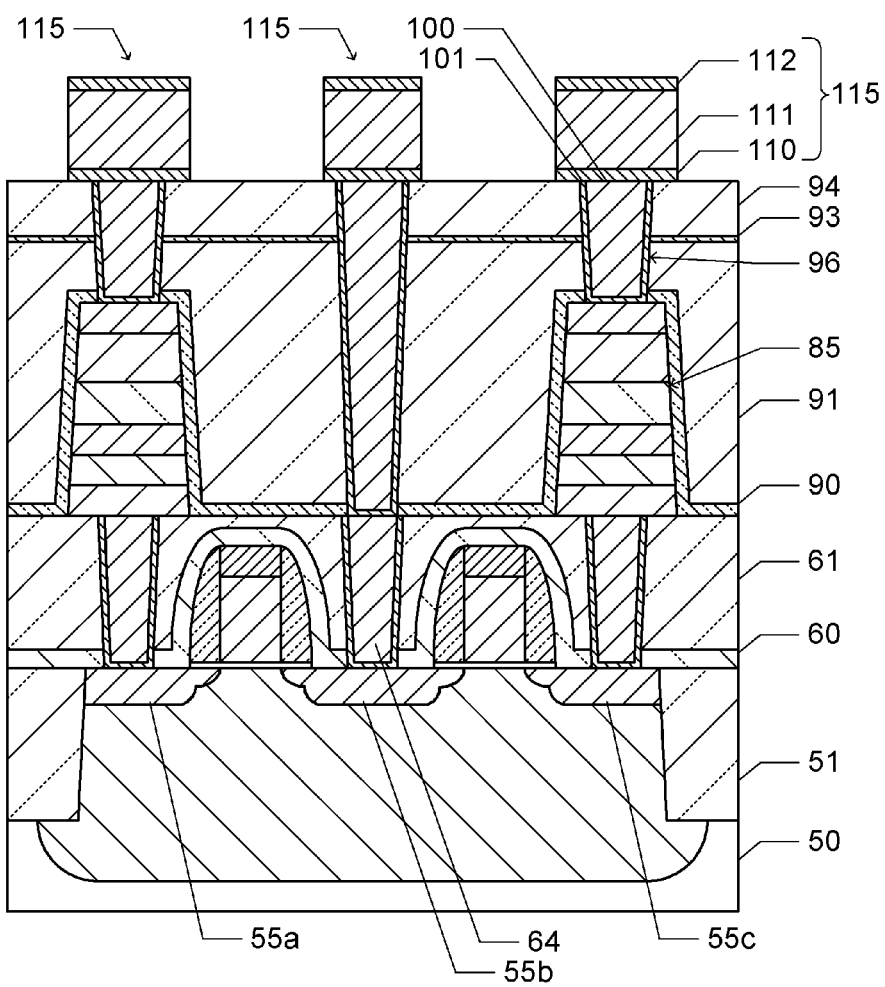

As illustrated in FIG. 11L, a plurality of wirings 115 are formed on the interlayer insulating film 94. Each wiring 115 has the structure that a lower glue film 110, a main wiring film 111 and an upper glue film 112 are stacked in this order. The lower glue film 110 consists of two layers of a Ti film having a thickness of 60 nm and a TiN film having a thickness of 30 nm. The main wiring layer 111 consists of an AlCu alloy film having a thickness of 400 nm. The upper glue layer 112 consists of two layers of a Ti film having a thickness of 5 nm and a TiN film having a thickness of 70 nm. These films are formed by sputtering.

Some of the wirings 115 are connected to the upper electrodes 83 of the ferroelectric capacitors 85 via the conductive plugs 101. One of the wirings 115 is connected to the impurity diffusion region 55b via the conductive plug 101 and underlying conductive plug 64.

Figure 11M:
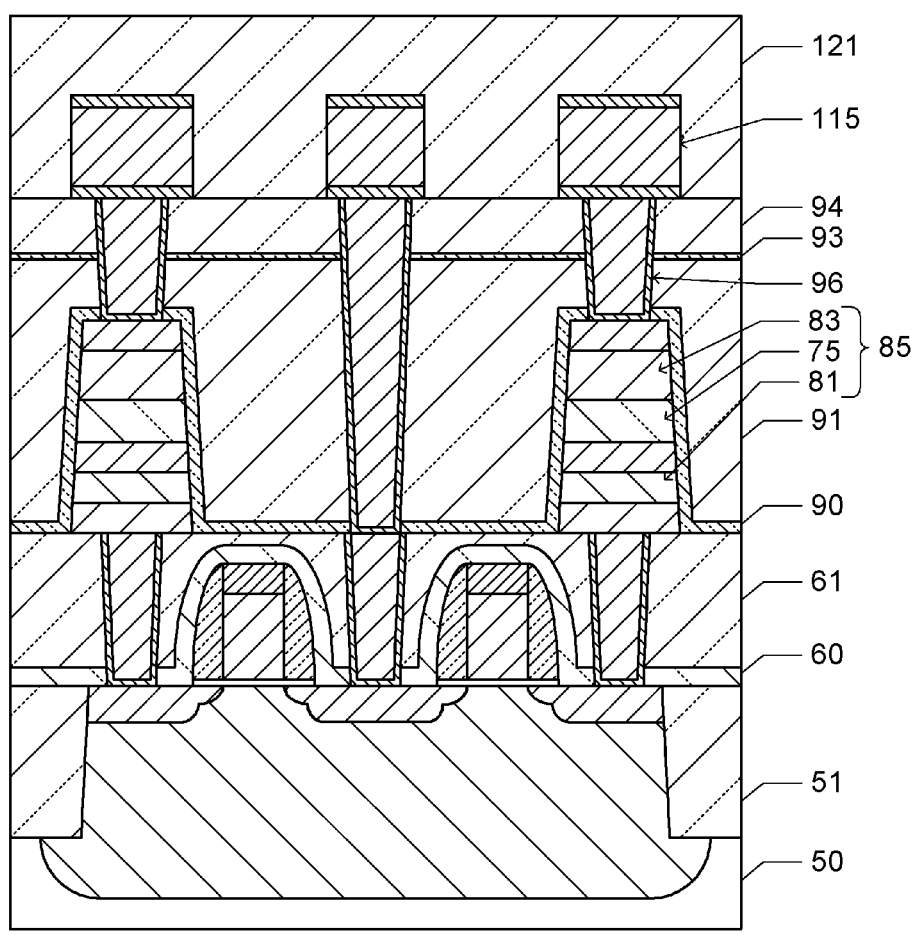

As illustrated in FIG. 11M, an interlayer insulating film 121 of HDP-SIO is formed on the interlayer insulating film 94 and wirings 115, and the surface of the interlayer insulating film 121 is planarized. The flat capacitor protective film 93 of ALO, the interlayer insulating film 94 of TEOS-SIO and the interlayer insulating film 121 of HDP-SIO correspond to three layers of the ALO film 23, the TEOS-SIO film 24 and the HDP-SIO film 22 of the evaluation sample illustrated in FIG. 7A, respectively.

Therefore, the interlayer insulating film 94 of TEOS-SIO serves as a protective film for the flat capacitor protective film 93 when the interlayer insulating film 121 of HDP-SIO is formed. By setting a thickness of the interlayer insulating film 94 of TEOS-SIO sufficiently thick, e.g., equal to or thicker than 300 nm, it is possible to maintain the hydrogen diffusion preventive function of the flat capacitor protective film 93.

Figure 11N:
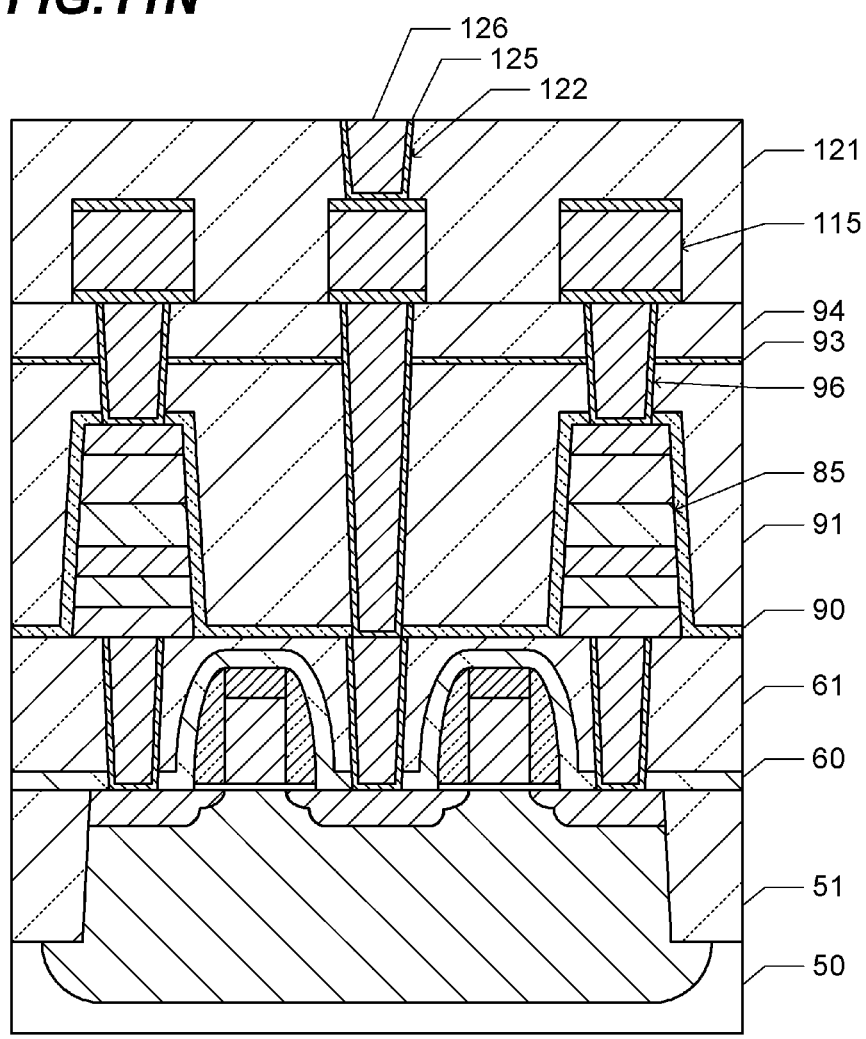

As illustrated in FIG. 11N, a via hole 122 is formed in the interlayer insulating film 121, reaching the wiring 115. The inner surface of the via hole 122 is covered with a glue film 125 of TiN. A conductive plug 126 made of W is embedded in the via hole 122.

Figure 11O:
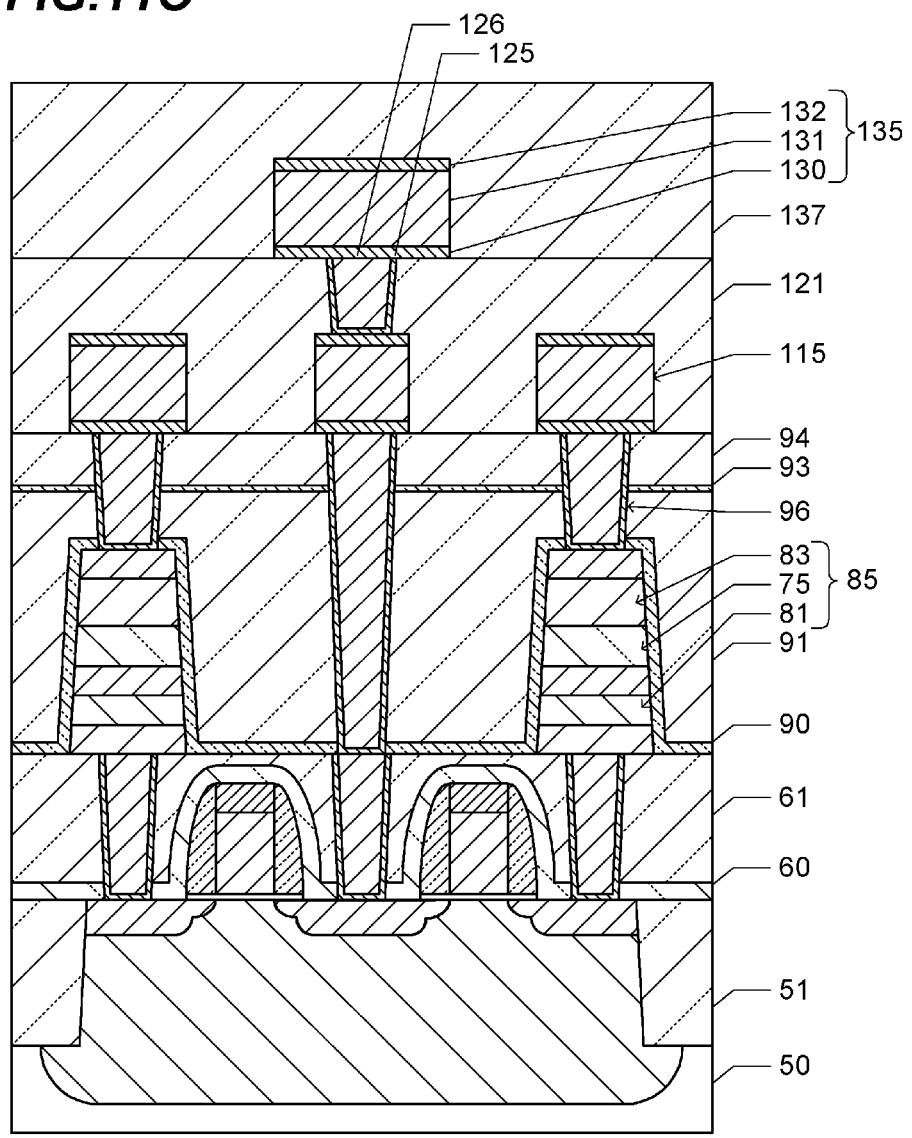

As illustrated in FIG. 11O, a wiring 135 connected to the conductive plug 126 is formed on the interlayer insulating film 121. The wiring 135 has the lamination structure constituted of a lower glue film 130, a main wiring film 131 and an upper glue film 132, as with the underlying wiring 115. An interlayer insulating film 137 of HDP-SIO is formed on the interlayer insulating film 121 and the wiring 135.

The capacitor protective film 90 and the flat capacitor protective film 93 prevent hydrogen diffusion while the interlayer insulating film 137 and interlayer insulating films used for multi wirings over the interlayer insulating film 137 are formed. It is therefore possible to prevent reduction of the ferroelectric film 75 constituting the ferroelectric capacitor 85. In the result, it is possible to prevent the performance of the ferroelectric capacitor 85 from being degraded.

Figure 12:
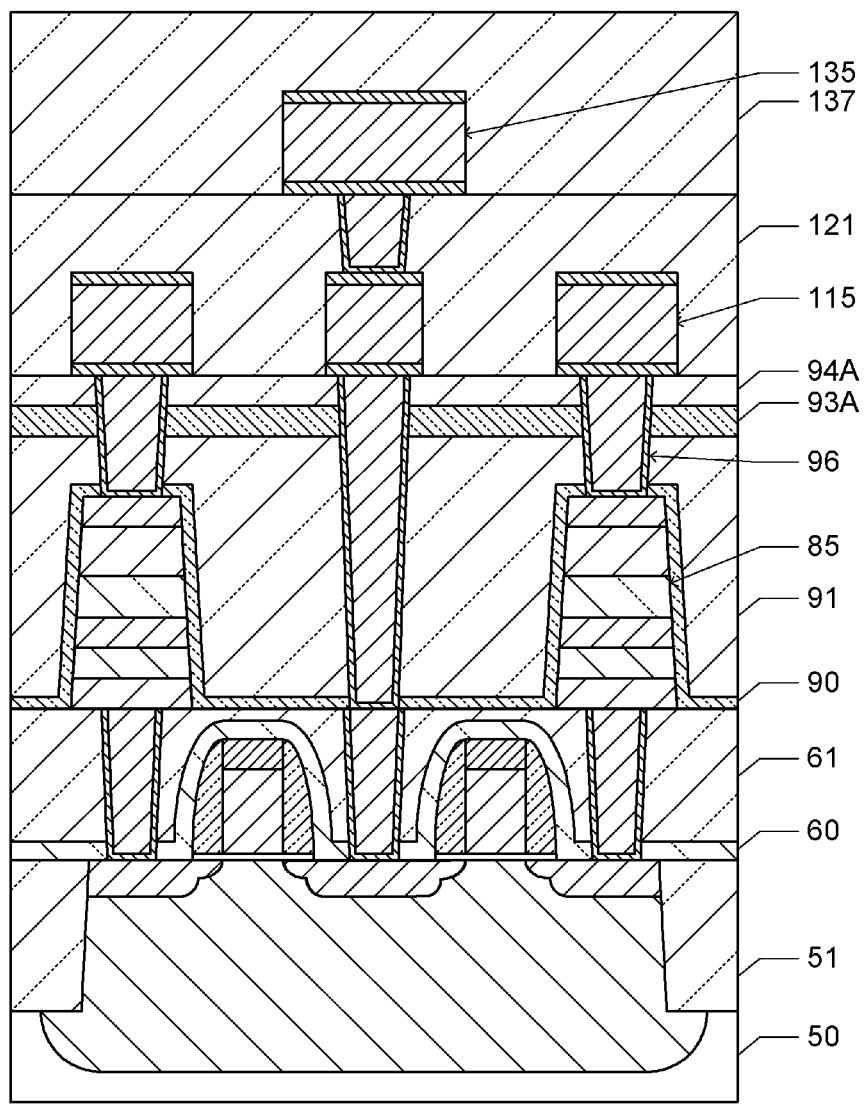
FIG. 12 is a cross sectional view of a semiconductor device manufactured by a semiconductor device manufacture method according to a second embodiment.

FIG. 12 is a cross sectional view of a ferroelectric capacitor according to the second embodiment. Description will be made by paying attention to different points from the ferroelectric memory of the first embodiment illustrated in FIG. 11O.

In the first embodiment, a thickness of the flat capacitor protective film 93 of ALO is set to 20 nm and a thickness of the interlayer insulating film 94 of TEOS-SIO formed on the flat capacitor protective film 93 is set to 300 nm, whereas in the second embodiment, a thickness of a flat capacitor protective film 93A is set equal to or thicker than 30 nm. An interlayer insulating film 94A of TEOS-SIO formed on the flat capacitor protective film 93A may be thinner than 300 nm or may be omitted.

The ALO film 23 and the HDP-SIO film 22 of the evaluation samples illustrated in FIGS. 3A and 10A correspond to the flat capacitor protective film 93A and the interlayer insulating film 94A of HDP-SIO, respectively. Since the thickness of the flat capacitor protective film 93A is set equal to or thicker than 30 nm, the hydrogen diffusion preventive function of the flat capacitor protective film 93A is able to be maintained even if the interlayer insulating film 121 of HDP-SIO is formed thereon.

Figure 13A:
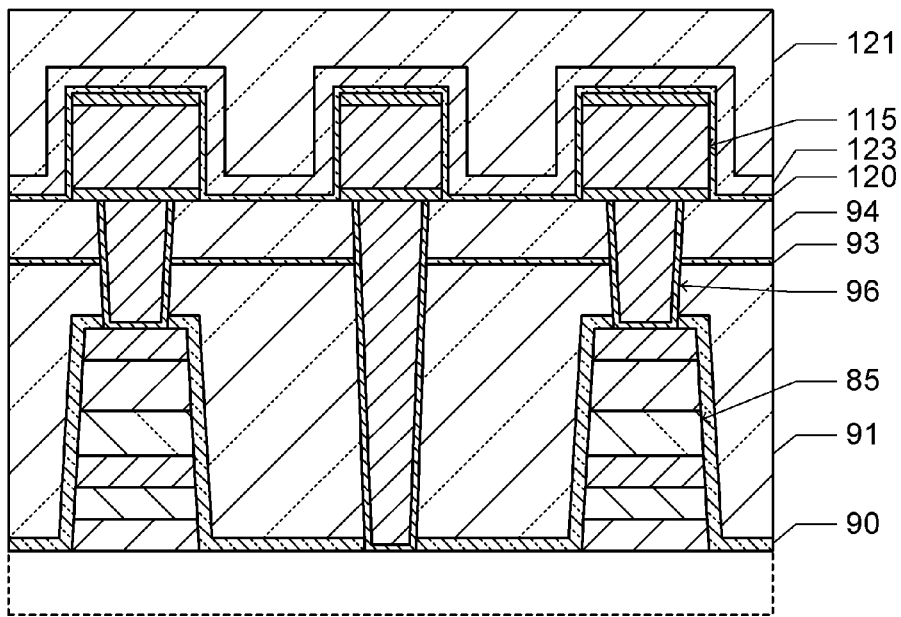
FIGS. 13A to 13C are cross sectional views of a semiconductor device during manufacture of a semiconductor device manufacture method according to a third embodiment.
Figure 13B:
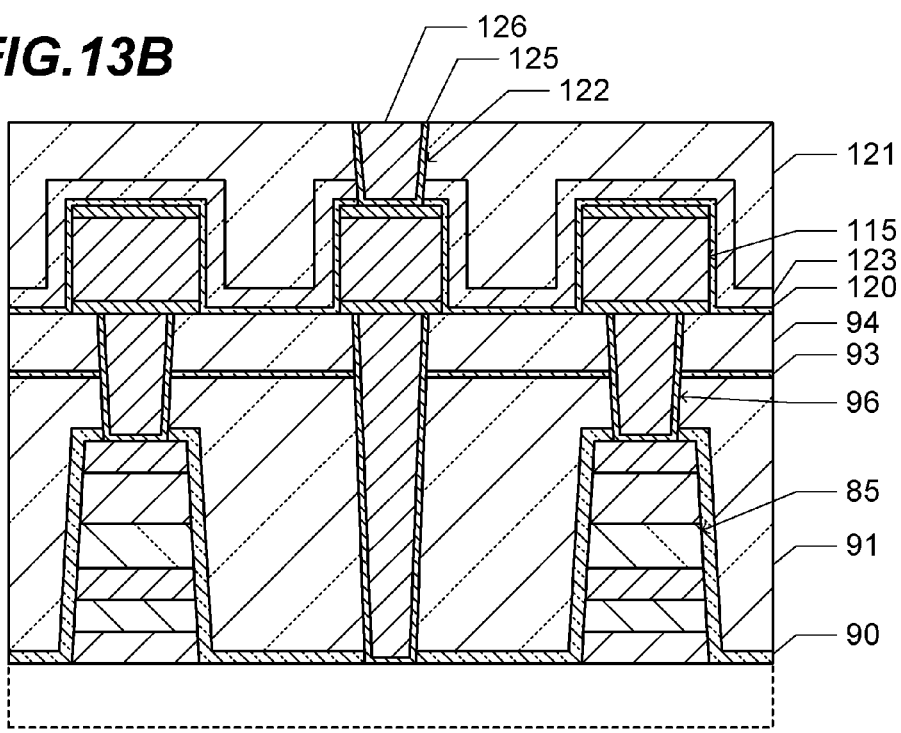
Figure 13C:
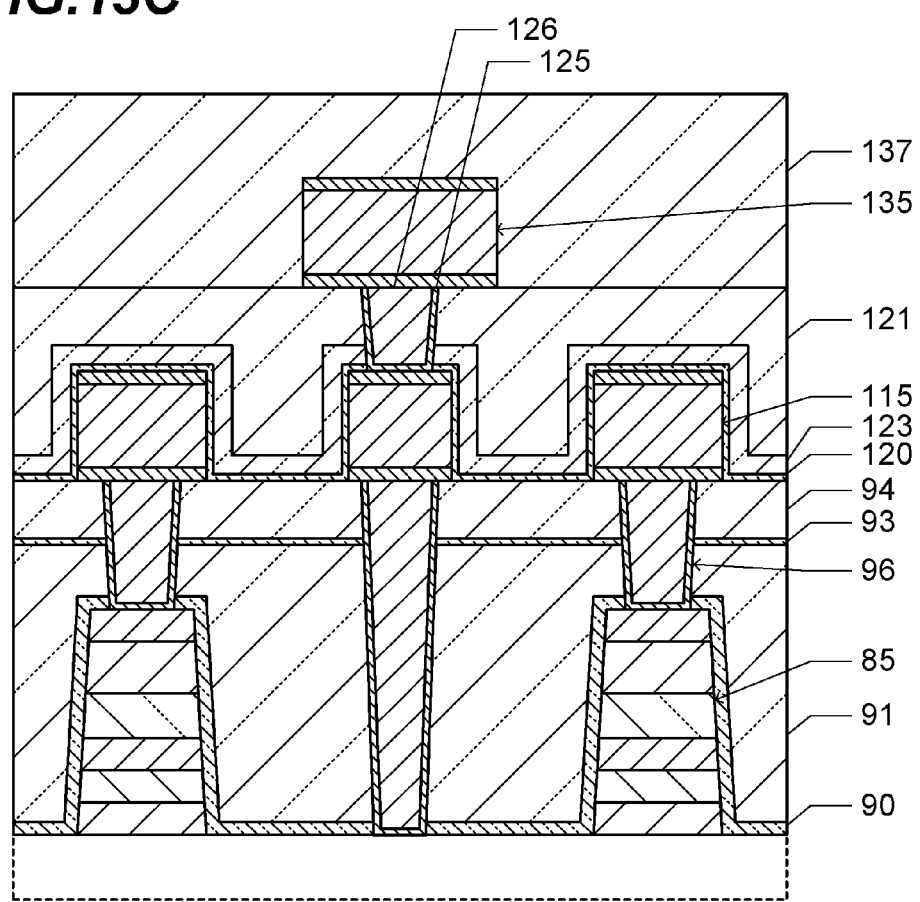

With reference to FIG. 13A to 13C, description will be made on a manufacture method for a ferroelectric memory according to the third embodiment. Processes up to forming the wirings 115 of the ferroelectric memory of the first embodiment illustrated in FIG. 11L are common to processes of the manufacture method for the ferroelectric memory of the third embodiment.

As illustrated in FIG. 13A, a capacitor protective film 120 of ALO having a thickness of 20 nm is formed on the interlayer insulating film 94 and the wirings 115, by CVD or ALD. On this capacitor protective film 120, an interlayer insulating film 123 of TEOS-SIO and an interlayer insulating film 121 of HDP-SIO are sequentially formed. Thereafter, the interlayer insulating film 121 of HDP-SIO is subjected to CMP to planarize the surface thereof.

As illustrated in FIG. 13B, a via hole 122 is formed through the interlayer insulating films 121, 123 and the capacitor protective film 120 to expose an upper surface of the wiring 115. The inner surface of the via hole 122 is covered with a glue film 125, and a conductive plug 126 is embedded in the via hole 122.

As illustrated in FIG. 13C, a wiring 135 is formed on the interlayer insulating film 121. The wiring 135 is connected to the conductive plug 126. An interlayer insulating film 137 of HDP-SIO is formed on the interlayer insulating film 121 and the wiring 135.

In the third embodiment, the interlayer insulating film 123 of TEOS-SIO formed on the capacitor protective film 120 of ALO has a function of protecting the capacitor protective film while the interlayer insulating film 121 of HDP-SIO is formed. By properly setting a thickness of the interlayer insulating film 123, it is possible to maintain the hydrogen diffusion preventive function of the capacitor protective film 120. The capacitor protective film 120 prevents hydrogen from reaching the ferroelectric capacitor 85 during processes of forming the interlayer insulating films 121 and 137 on the capacitor protective film 120. The flat capacitor protective film 93 of ALO may be omitted. In this case, the capacitor protective film 120 of ALO serves as the second protective film.

Figure 14:
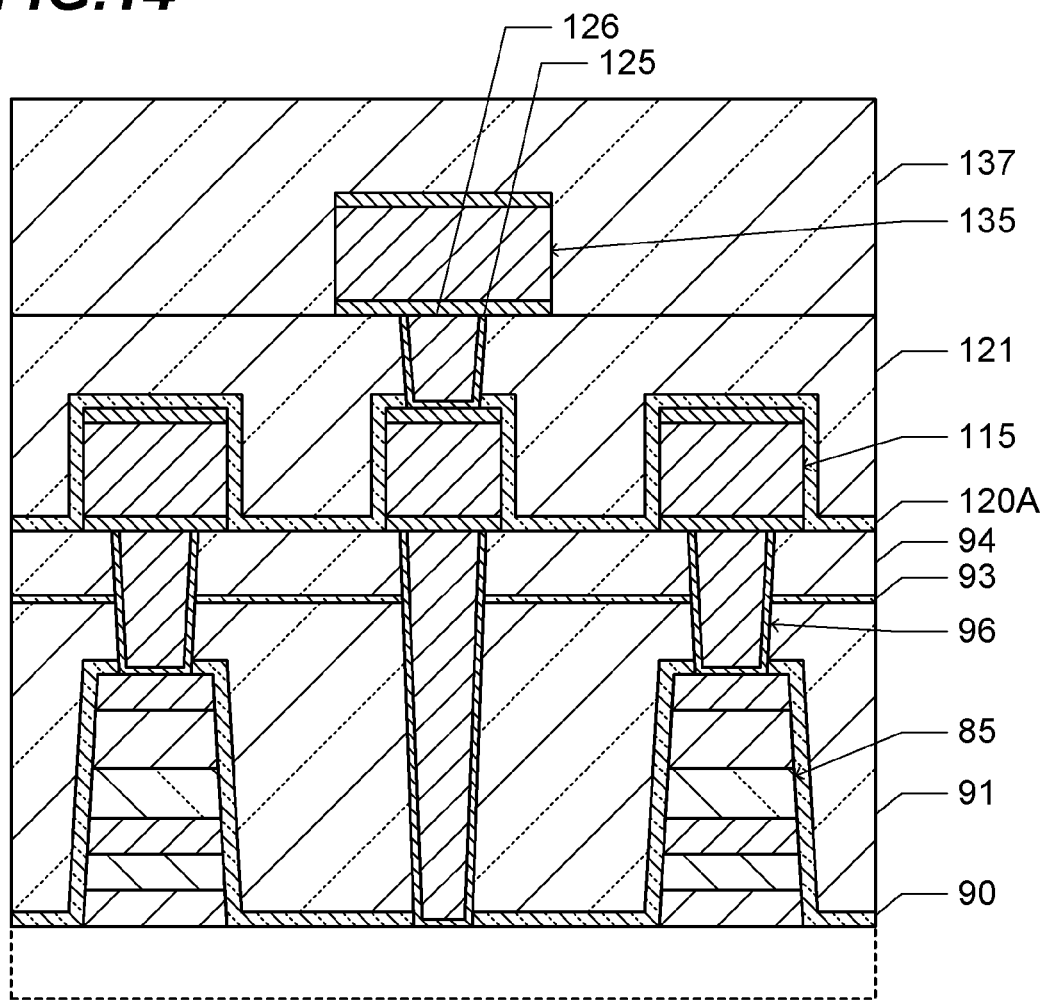
FIG. 14 is a cross sectional view of a semiconductor device manufactured by a semiconductor device manufacture method according to a fourth embodiment.

FIG. 14 is a cross sectional view of a ferroelectric capacitor according to the fourth embodiment. Description will be made by paying attention to different points from the ferroelectric memory of the third embodiment illustrated in FIG. 13C.

In the third embodiment, a thickness of the flat capacitor protective film 120 formed on the wirings 115 is set to 20 nm, whereas in the fourth embodiment, a capacitor protective film 120A of ALO having a thickness of 30 nm is formed on the wirings 115. The interlayer insulating film 123 of TEOS-SIO of the third embodiment is not formed in the fourth embodiment.

Since the thickness of the capacitor protective film 120A is set to 30 nm, the hydrogen diffusion preventive function of the capacitor protective film 120A is able to be maintained even if the interlayer insulating film 121 of HDP-SIO is formed on the capacitor protective film 120A.

Figure 15A:
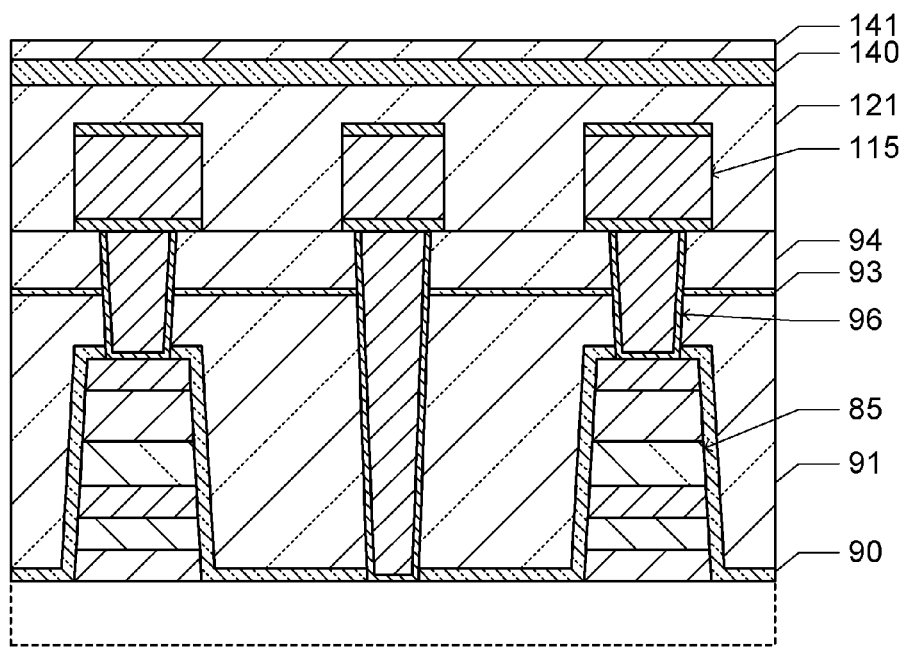
FIGS. 15A to 15C are cross sectional views of a semiconductor device during manufacture of a semiconductor device manufacture method according to a fifth embodiment.
Figure 15B:
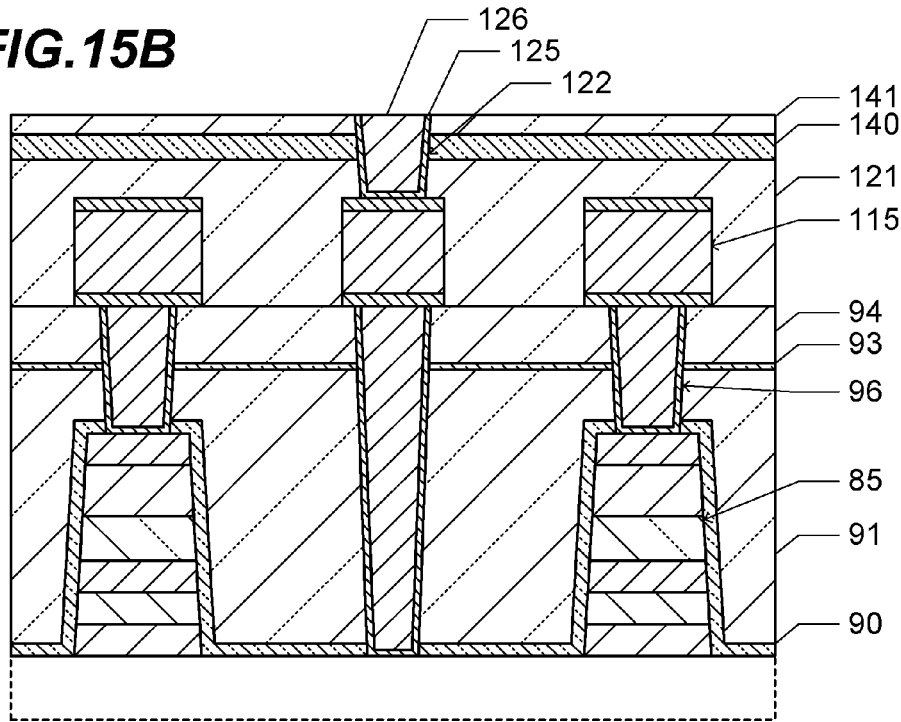
Figure 15C:
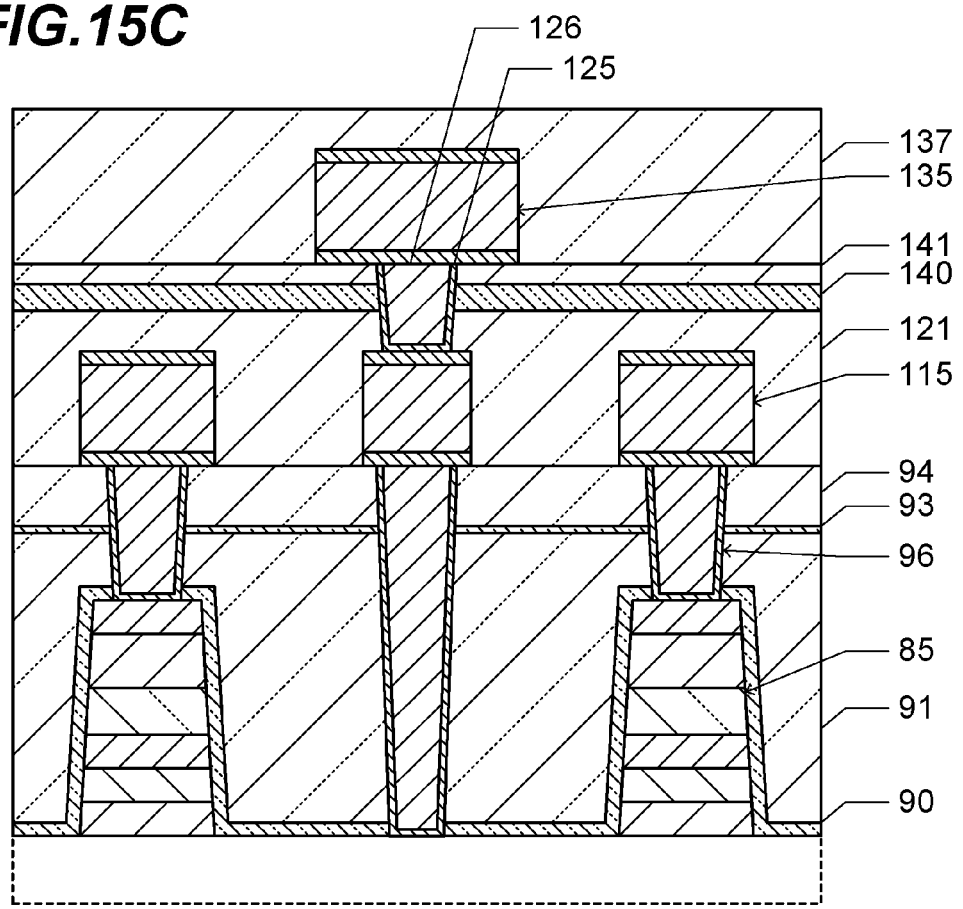

With reference to FIG. 15A to 15C, description will be made on a manufacture method for a ferroelectric memory according to the fifth embodiment. Processes up to forming the wirings 115 of the ferroelectric memory of the first embodiment illustrated in FIG. 11L are common to processes of the manufacture method for the ferroelectric memory of the fifth embodiment.

As illustrated in FIG. 15A, an interlayer insulating film 121 of HDP-SIO is formed on the interlayer insulating film 94 and the wirings 115. After the surface of the interlayer insulating film 121 is planarized, a capacitor protective film 140 of ALO having a thickness of 30 nm is formed on the interlayer insulating film 121. An interlayer insulating film 141 of TEOS-SIO is formed on the capacitor protective film 140.

As illustrated in FIG. 15B, a via hole 122 is formed through the interlayer insulating film 141 of TEOS-SIO, the flat capacitor protective film 140 of ALO and the interlayer insulating film 121 of HDP-SIO, reaching the upper surface of the wiring 115. The inner surface of the via hole 122 is covered with a glue film 125, and a conductive plug 126 is embedded in the via hole 122.

As illustrated in FIG. 15C, a wiring 135 is formed on the interlayer insulating film 141. The wiring 135 is connected to the underlying conductive plug 126. An interlayer insulating film 137 of HDP-SIO is formed on the interlayer insulating film 141 and the wiring 135.

It is possible to consider that the flat capacitor protective film 140 of ALO and the interlayer insulating film 137 of HDP-SIO correspond to the ALO film 23 and the HDP-SIO film 22 illustrated in FIGS. 3A and 10A, respectively. Since a thickness of the flat capacitor protective film 140 is set equal to or thicker than 30 nm, the hydrogen diffusion preventive function of the flat capacitor protective film 140 is able to be maintained even if the interlayer insulating film 137 of HDP-SIO is formed on the flat capacitor protective film 140. A thickness of the interlayer insulating film 141 of TEOS-SIO is arbitrary, and the interlayer insulating film 141 need not be disposed. The flat capacitor protective film 93 of ALO may be omitted. In this case, the flat capacitor protective film 140 serves as the second capacitor protective film.

Figure 16:
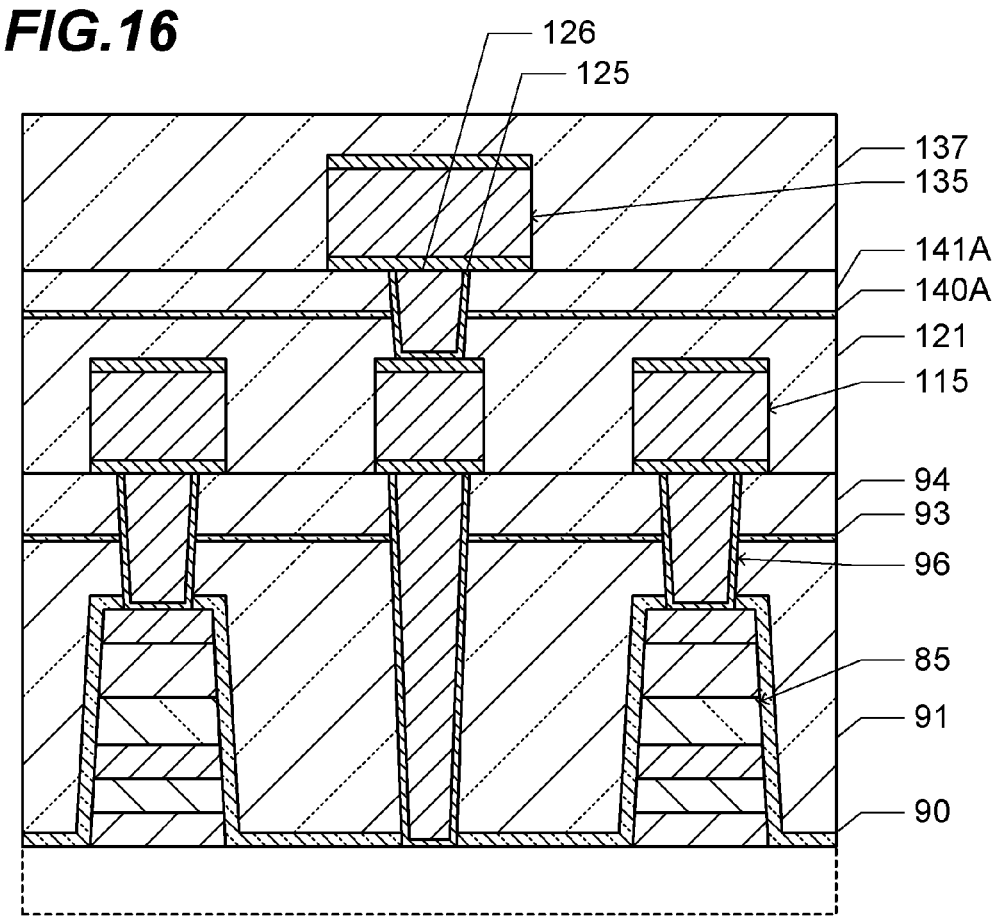
FIG. 16 is a cross sectional view of a semiconductor device manufactured by a semiconductor device manufacture method according to a sixth embodiment.

FIG. 16 is a cross sectional view of a ferroelectric capacitor according to the sixth embodiment. Description will be made by paying attention to different points from the ferroelectric memory of the fifth embodiment illustrated in FIG. 15C.

In the fifth embodiment, a thickness of the flat capacitor protective film 140 is set equal to or thicker than 30 nm to maintain the hydrogen diffusion preventive function thereof. In the sixth embodiment, a flat capacitor protective film 140A of ALO having a thickness of 20 nm is disposed in place of the flat capacitor protective film 140. In the fifth embodiment, a thickness of the interlayer insulating film 141 of TEOS-SIO on the flat capacitor protective film 140 is arbitrary, whereas in the sixth embodiment, a thickness of an interlayer insulating film 141A of TEOS-SIO disposed on the flat capacitor protective film 140A is set to a thickness sufficient for protecting the flat capacitor protective film 140A, e.g., 300 nm or thicker than 300 nm.

While the interlayer insulating film 137 of HDP-SIO is formed on the interlayer insulating film 141A, the interlayer insulating film 141A protects the flat capacitor protective film 140A so that it is possible to maintain the hydrogen diffusion preventive function of the flat capacitor protective film 140A.

Figure 17:
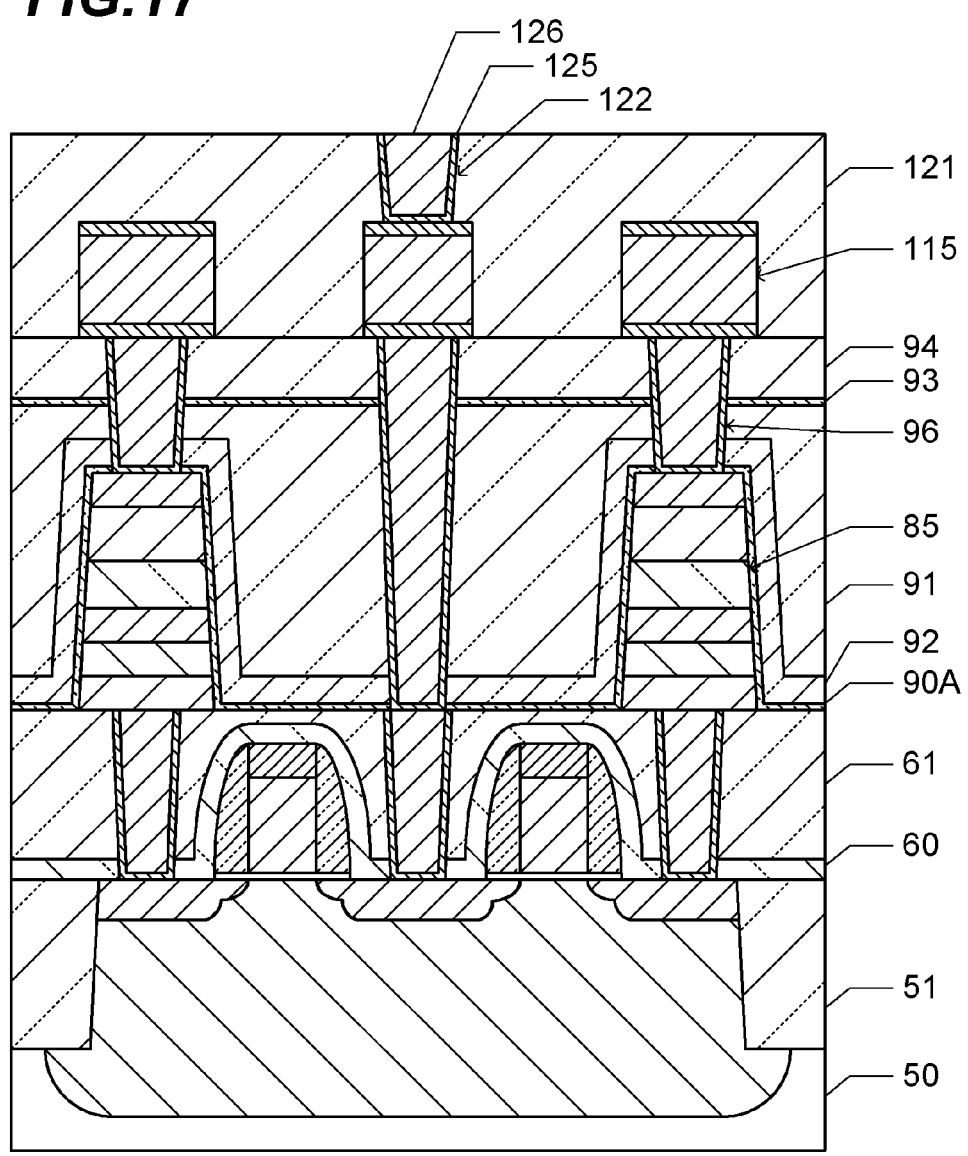
FIG. 17 is a cross sectional view of a semiconductor device manufactured by a semiconductor device manufacture method according to a seventh embodiment.

FIG. 17 is a cross sectional view of a ferroelectric capacitor according to the seventh embodiment. Description will be made by paying attention to different points from the ferroelectric memory of the first embodiment illustrated in FIG. 11O.

In the first embodiment, the capacitor protective film 90 covering the ferroelectric capacitor 85 is made thick, e.g., equal to or thicker than 30 nm, to maintain the hydrogen diffusion preventive function thereof. In the seventh embodiment, a thickness of a capacitor protective film 90A covering the ferroelectric capacitor 85 is set to 20 nm. In order to maintain the hydrogen diffusion preventive function of the thin capacitor protective film 90A, an interlayer insulating film 92 of TEOS-SIO is disposed between the capacitor protective film 90A and the interlayer insulating film 91 of HDP-SIO. The interlayer insulating film 92 of TEOS-SIO has a thickness sufficient for protecting the underlying capacitor protective film 90A.

While the interlayer insulating film 91 of HDP-SIO is formed, the interlayer insulating film 92 of TEOS-SIO protects the capacitor protective film 90A so that it is possible to maintain the hydrogen diffusion preventive function of the capacitor protective film 90A.

As described above, in each embodiment, in order to maintain the hydrogen diffusion preventive function of the capacitor protective film of ALO, the capacitor protective film itself is made thick (hereinafter called "structure A") or an insulating film of TEOS-SIO having a sufficient thickness is disposed on the capacitor protective film (hereinafter called "structure B").

The TEOS-SIO film has the embedding characteristics inferior to those of the HDP-SIO film. Therefore, if fine steps are formed on a surface just below a capacitor protective film of ALO and high embedding characteristics are required for the insulating film to be formed thereon, it is effective for adopting the structure A unnecessary for forming the TEOS-SIO film.

Further, since it is more difficult to etch the ALO film than etching the TEOS-SIO film and the HDP-SIO film, if the ALO film is made thick, a burden on an etching process increases. Therefore, if it is desired to prevent a burden on an etching process from being increased, it is effective for adopting the structure B capable of thinning the ALO film.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A manufacture method for a semiconductor device comprising:

forming a ferroelectric capacitor over a semiconductor substrate, the ferroelectric capacitor comprising a lower electrode, a ferroelectric film and an upper electrode stacked in an order recited;

forming a capacitor protective film of aluminum oxide, the capacitor protective film covering the ferroelectric capacitor;

forming a lower insulating film of silicon oxide having a thickness equal to or thicker than 300 nm over the capacitor protective film by plasma enhanced chemical vapor deposition using tetraethoxysilane-containing gas as source gas;

forming an upper insulating film of silicon oxide directly on and in contact with the lower insulating film by chemical vapor deposition using high density plasma;

planarizing a surface of the upper insulating film;

forming an upper capacitor protective film of aluminum oxide over the planarized upper insulating film;

forming an upper first insulating film of silicon oxide having a thickness equal to or thicker than 300 nm over the upper capacitor protective film by plasma enhanced chemical vapor deposition using tetraethoxysilane-containing gas as source gas;

forming a first wiring of conductive material over the upper first insulating film; and forming an upper second insulating film of silicon oxide over the upper first insulating film by chemical vapor deposition using high density plasma, the upper second insulating film covering the first wiring.

2. The manufacture method for a semiconductor device according to claim 1, wherein the capacitor protective film is formed by chemical vapor deposition.

3. The manufacture method for a semiconductor device according to claim 1, wherein the capacitor protective film is formed by atomic layer deposition for alternately supplying ozone and trimethylaluminum.

4. A manufacture method for a semiconductor device comprising:
- forming a ferroelectric capacitor over a semiconductor substrate, the ferroelectric capacitor comprising a lower electrode, a ferroelectric film and an upper electrode stacked in an order recited;
- forming a capacitor protective film of aluminum oxide, the capacitor protective film covering the ferroelectric capacitor;
- forming a lower insulating film of silicon oxide over the capacitor protective film by plasma enhanced chemical vapor deposition using tetraethoxysilane-containing gas as source gas; and
- forming an upper insulating film of silicon oxide on and in contact with the lower insulating film by chemical vapor deposition using high density plasma,
- wherein a thickness of the lower insulating film is equal to or thicker than a lower limit thickness, the lower limit thickness being defined through a process comprising:
- preparing samples, each of the samples comprising a substrate, a Ti film on the substrate, an aluminum oxide film having a thickness of 20 nm on the Ti film, a first silicon oxide film on the aluminum oxide film, and a second silicon oxide film on the first silicon oxide film, the aluminum oxide film being formed in a same way as the capacitor protective film, the first silicon oxide film being formed in a same way as the lower insulating film, the second silicon oxide film being formed in a same way as the upper insulating film, thicknesses of the first silicon oxide films of the samples being different from one another;
- performing thermal desorption spectroscopy for the samples to obtain hydrogen desorption spectrums;
- extracting some samples as first samples from the samples, each of the first samples having no peak of the hydrogen desorption spectrum in a temperature range equal to or lower than 700 ° C. and having a peak of the hydrogen desorption spectrum in a temperature range higher than 700 ° C.; and
- adopting, as the lower limit thickness, a thickness of the first silicon oxide film of one sample whose first silicon oxide film is thinnest among the first silicon oxide films of the first samples.

* * * * *